(12) United States Patent
Frederickson et al.

(10) Patent No.: US 6,263,294 B1
(45) Date of Patent: Jul. 17, 2001

(54) IMPEDANCE SPECTROSCOPY MEASUREMENT SYSTEM

(75) Inventors: Michael D. Frederickson, Indianapolis; Jeff K. Latham, New Castle; Alex E. Cragoe, Indianapolis, all of IN (US)

(73) Assignee: American Competitiveness Institute, Inc., Plymouth Meeting, PA (US)

( * ) Notice: Subject to any disclaimer, the term of this patent is extended or adjusted under 35 U.S.C. 154(b) by 0 days.

(21) Appl. No.: 09/033,522

(22) Filed: Mar. 2, 1998

(51) Int. Cl.$^7$ ..................................................... G01R 27/08
(52) U.S. Cl. .......................... 702/117; 702/124; 324/527
(58) Field of Search .......................... 702/22, 23, 35.38, 702/57–59, 66, 67, 69, 71–73, 75, 76, 81–84, 124; 324/500, 512, 520–523, 525, 527

(56) References Cited

U.S. PATENT DOCUMENTS

| | | |
|---|---|---|
| 3,440,529 | 4/1969 | Bauhaus et al. . |
| 3,448,380 | 6/1969 | Harrington . |
| 3,482,161 | 12/1969 | Poulter . |
| 3,631,523 * | 12/1971 | Feetenby ............................... 200/175 |
| 4,463,434 * | 7/1984 | Haylett et al. .......................... 702/75 |
| 4,939,469 | 7/1990 | Ludwig et al. . |
| 5,103,181 | 4/1992 | Gaisford et al. . |
| 5,485,392 | 1/1996 | Frederickson et al. . |
| 5,656,933 | 8/1997 | Frederickson et al. . |
| 6,005,399 * | 12/1999 | Frederickson et al. .............. 324/717 |

OTHER PUBLICATIONS

Guy et al., "Analyzing Residues Using AC Impedance Techniques", Technical Paper presented at NEPCON West '97 Conference, Anaheim, CA, Feb. 23–27, 1997.
Kendig, Martin W., "Overview of the Science and Capability of Impedance Spectroscopy" (Date Unknown).
Seitz et al., "Monitoring Solder Pastes Using AC Impedance Spectroscopy", Alpha Metals Technical Brief, (Date Unknown).
"IS–4000 Monitor Your Process in Real Time", Alpha Metals brochure, 1997.

* cited by examiner

*Primary Examiner*—Marc S. Hoff
*Assistant Examiner*—Craig Steven Miller
(74) *Attorney, Agent, or Firm*—Bose McKinney & Evans LLP

(57) ABSTRACT

An impedance spectroscopy system characterizes the rheologic and thixotropic properties of solder paste and residues by measuring its impedance at various frequencies. The impedance spectroscopy system provides voltage and current inputs to a sample at various frequencies and measures the resulting impedance. The impedance spectroscopy system stores equivalent circuit parameters for multiple solder pastes and residues, controls the voltage and current inputs to the sample, displays measurement data in real-time, displays results, and notifies the operator if results exceed preset limits.

10 Claims, 29 Drawing Sheets

IMPEDANCE SPECTROSCOPY MEASUREMENT SYSTEM

TECHNICAL FIELD OF THE INVENTION

The invention relates to an on-line impedance spectroscopy system that characterizes the rheologic and thixotropic properties of solder paste and residues by measuring its impedance at various frequencies.

BACKGROUND OF THE INVENTION

A need for real time solder paste process control is critical due to the dynamic nature of solder paste. The rheology and thixotropic properties of solder paste can change dramatically during manufacture which can cause significant problems in the printablity of circuit boards using the solder paste. These changes are dependent on the manufacturing environment, the characteristics and age of the paste, and the previous treatment of the paste. A high humidity environment can cause an increase in slump and an increase in the occurrence of solder balls due to moisture absorption. Solder paste can also increase or decrease in viscosity with age. Changes in the flux material can impact the rheologic nature of the paste due to excessive build-up of reaction products between the flux activators and the metal oxides.

Methods currently used for measuring the rheology of solder paste include the use of a viscometer. A viscometer can measure the viscosity of solder paste at different shearing rates. In this way the viscosity of a solder paste can be tracked from a reference shear rate and the thixotropic character of the paste can be tracked by calculating the change in viscosity from the change in shear rate. Viscometer systems allow a manufacturer to calculate both viscosity and thixotropic behavior. However, these systems are primarily designed to make bulk rheologic measurements as an incoming inspection tool and typically require a large amount of paste for an accurate measurement.

A related patent is U.S. Pat. No. 5,656,933 issued Aug. 12, 1997. U.S. Pat. No. 5,103,181 discloses a composition and monitoring process that uses impedance measurements. U.S. Pat. No. 4,939,469 discloses a method for evaluating printed circuit boards using the impedance spectra of the board. U.S. Pat. Nos. 3,482,161; 3,440,529 and 3,448,380 all use spectroscopic analysis for analyzing samples.

SUMMARY OF THE INVENTION

The invention consists of both hardware and software which forms an on-line impedance spectroscopy system that characterizes the rheologic and thixotropic properties of solder paste and residues by measuring its impedance at various frequencies. The hardware provides voltage and current inputs to a sample at various frequencies and measures the resulting impedance. The software stores equivalent circuit parameters for multiple solder pastes and residues, controls the hardware inputs to the sample, displays measurement data in real-time, displays results, and notifies the operator if results exceed preset limits. The invention supports two probe, three probe and four probe surface and bulk measurements of the solder paste and associated residues in manufacturing.

It is an object of the present invention to support an auto-collection mode wherein a series of impedance spectroscopy tests can be set up by the operator and then occur without further operator intervention. The measurements and results from the auto-collection tests are stored for later review.

It is also an object of the present invention to provide a switch matrix through which multiple output probe interfaces are selectable for spectroscopy measurements. The output probe interfaces being in contact with one or more samples to be characterized Additional objects, advantages and novel features of the invention are set forth in the description that follows, and will become apparent to those skilled in the art upon reviewing the drawings in connection with the following description.

DETAILED DESCRIPTION OF THE DRAWINGS

Figure 1:
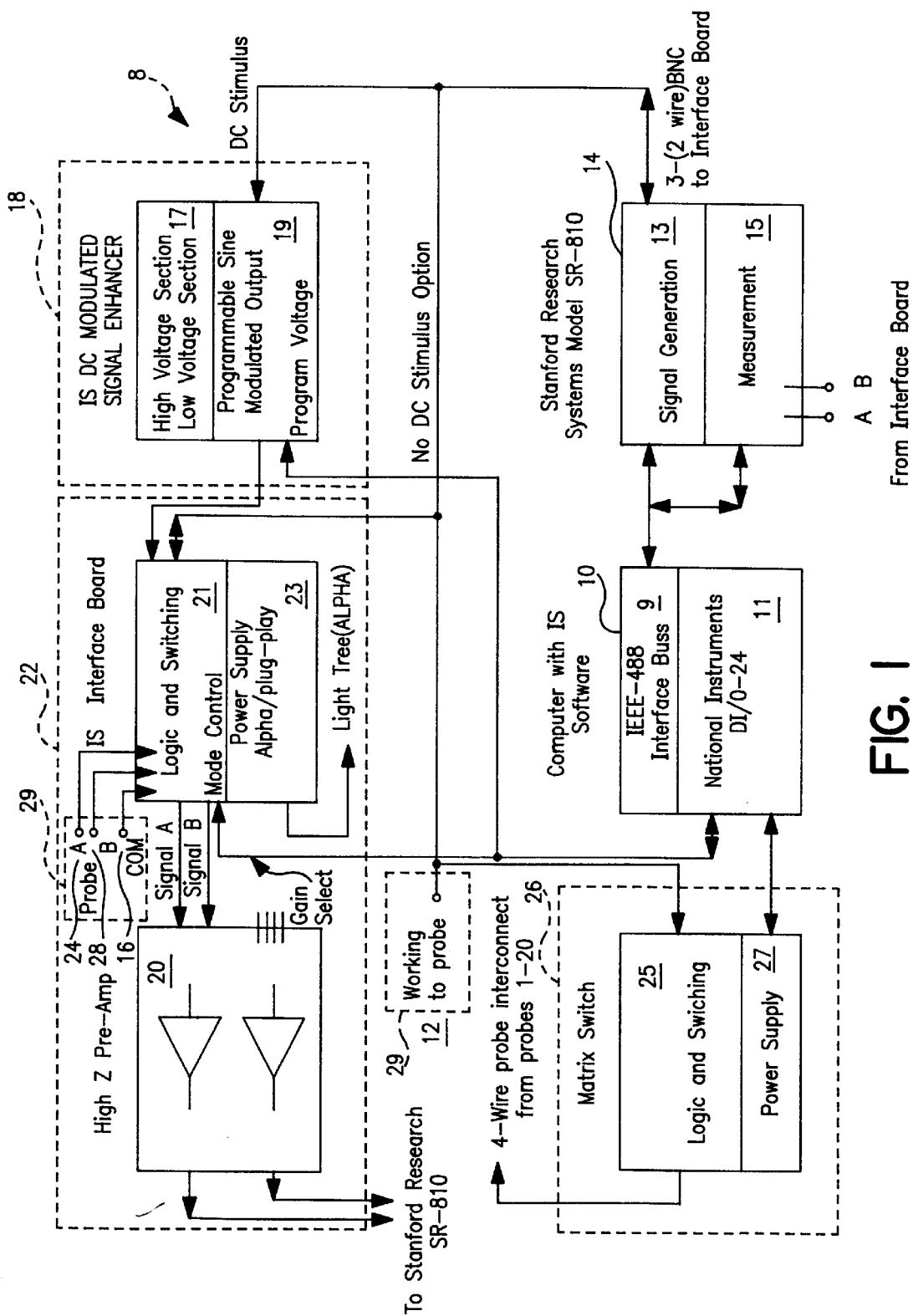
FIG. 1 is a top-level block diagram of the impedance spectroscopy (IS) system.
Figure 2A:
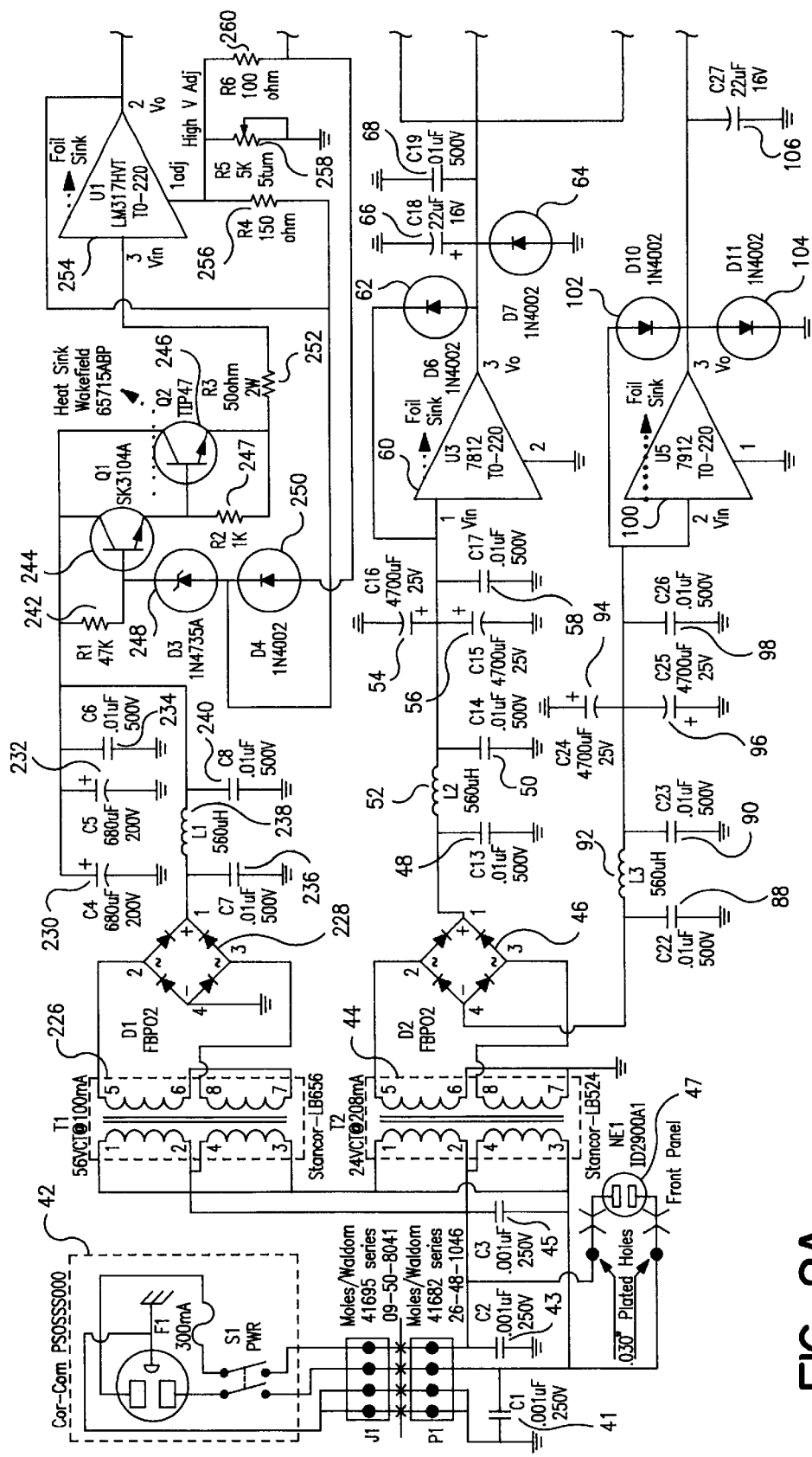
FIG. 2 is a circuit diagram of the IS DC bias/gain adder.
Figure 2B:
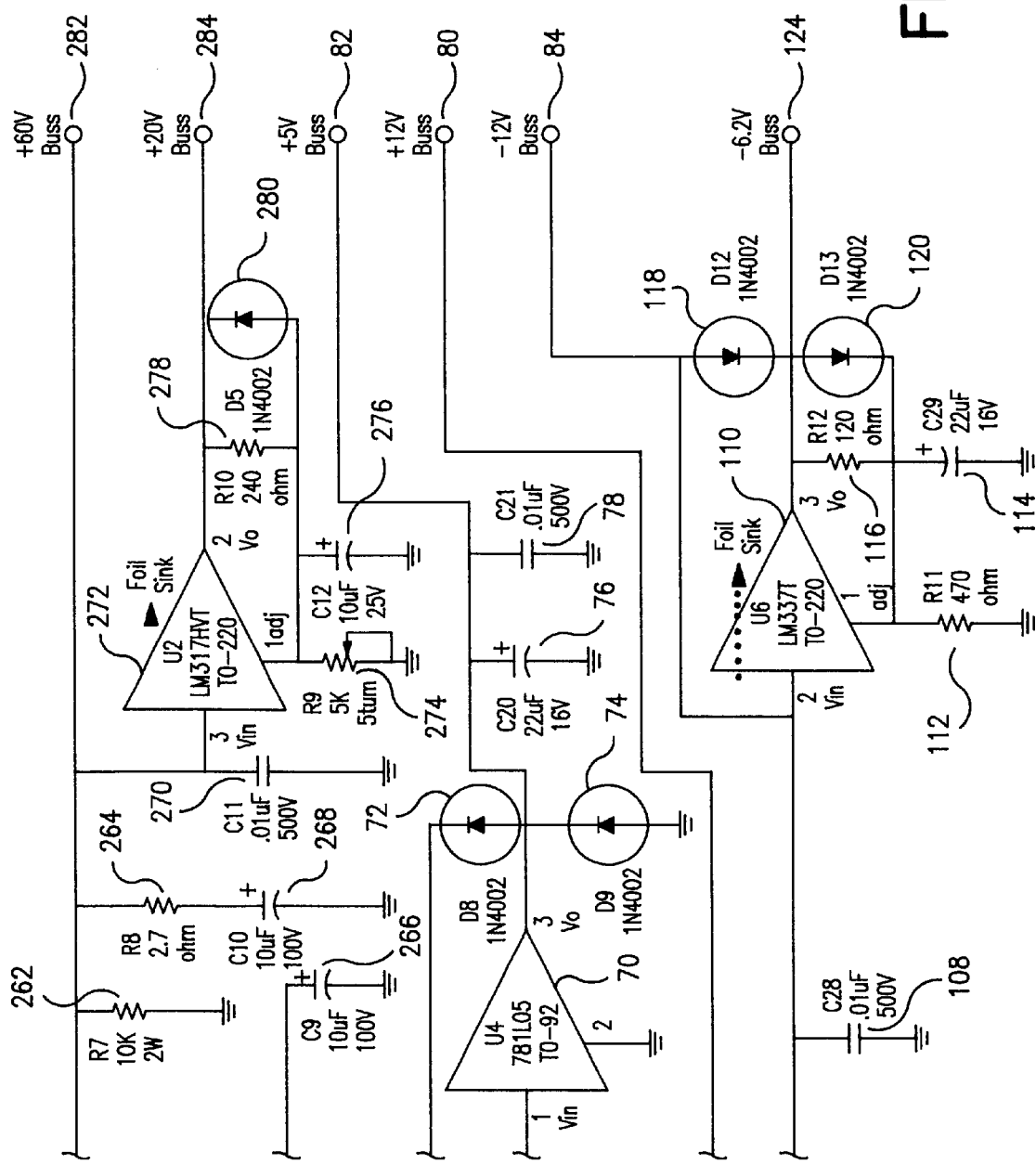
Figure 2C:
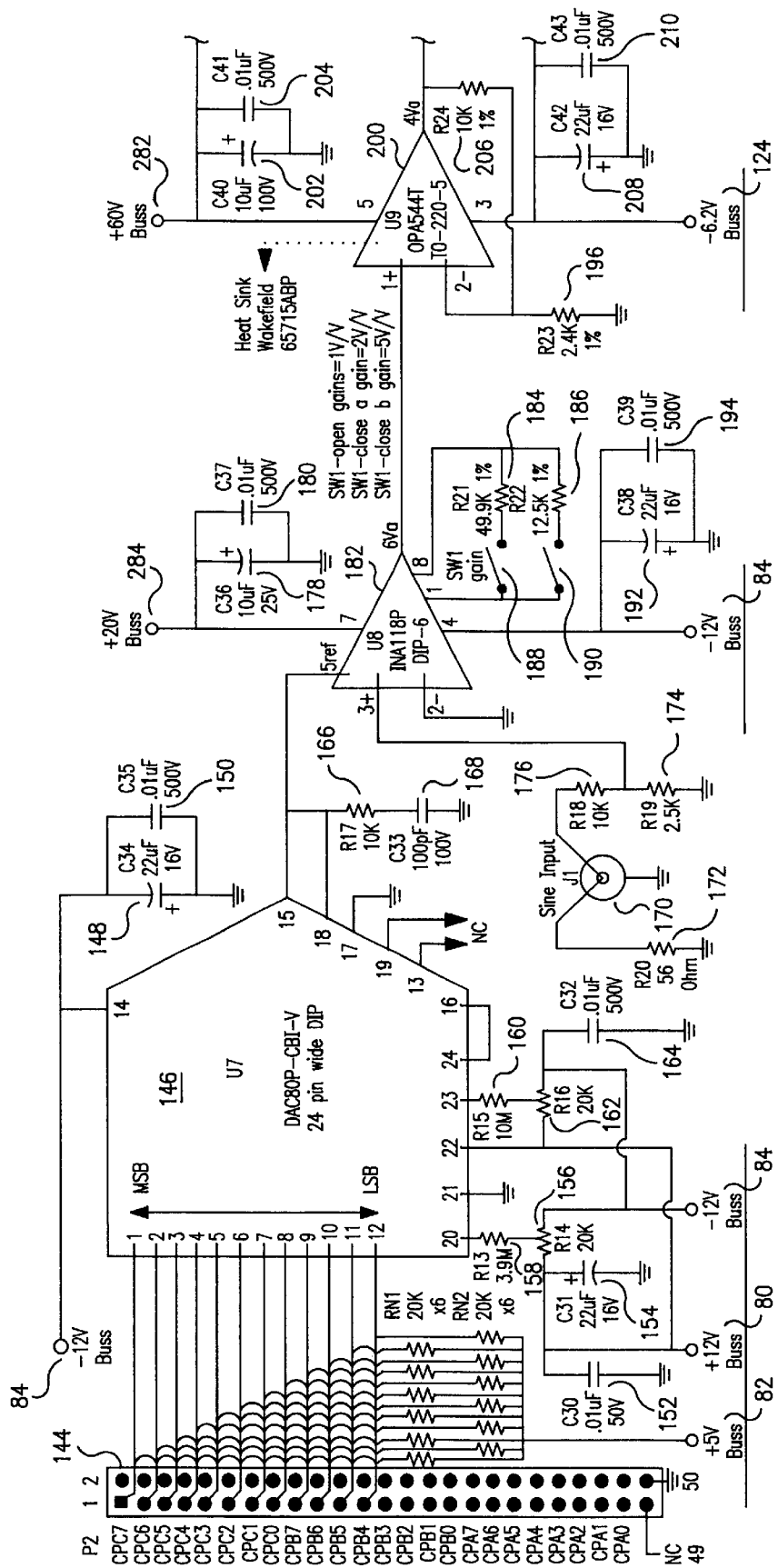
Figure 2D:
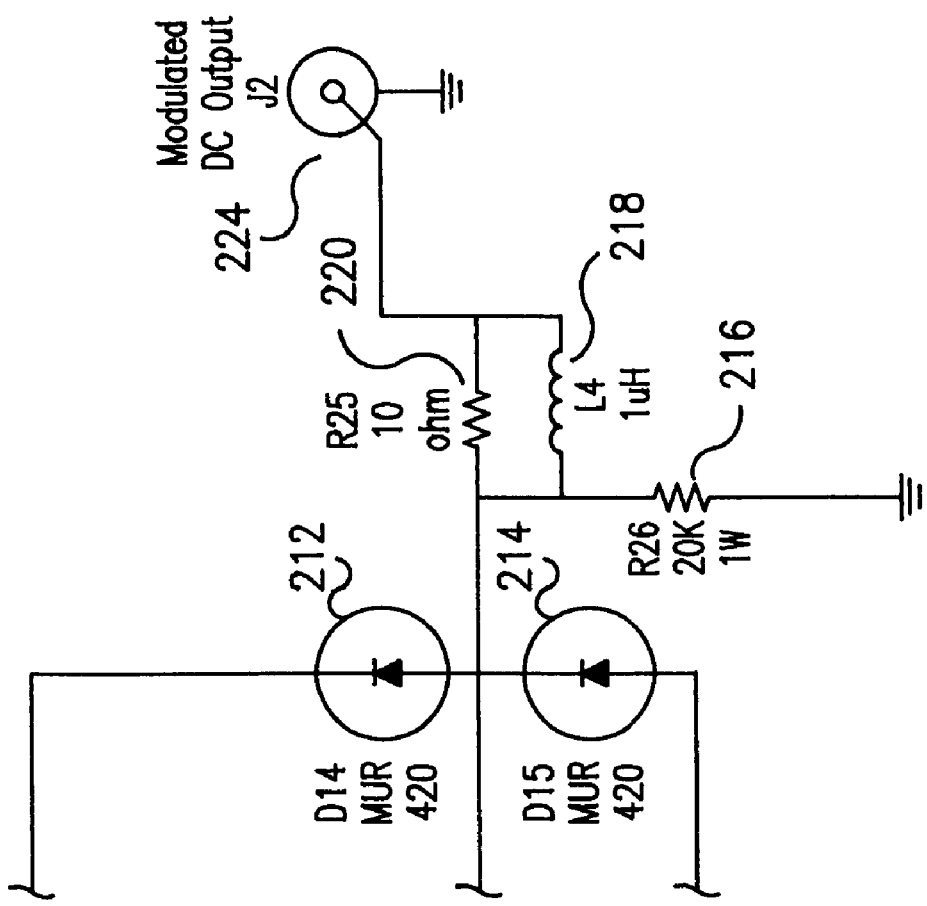

The Impedance Spectroscopy (IS) System 8 is comprised of five primary hardware components as shown in FIG. 1 and the software that controls these components. The computer 10 contains the IS software and controls the other components through an IEEE-488 interface 9 and a DI/O-24 interface 11. The SR-810 lock-in amplifier 14, controlled by the computer 10 through the IEEE-488 interface 9, generates AC signals to be applied to the sample under test. These signals are either input directly to the IS interface board 22 or are sent to the IS DC modulated signal enhancer 18. The DC modulated signal enhancer 18, controlled by the computer 10 through the DI/O-24 interface 11, takes the input signal from the SR-810 14, amplifies the signal, adds a DC bias, and then outputs the DC biased signal to the IS interface board 22. The DC biased signal from the DC modulated signal enhancer 18 has the same phase as the input signal from the SR-810 14.

The IS interface board 22, controlled by the computer 10 through the DI/O-24 interface 11, receives either an AC input signal from the SR-810 14 or a DC modulated input signal from the IS DC modulated signal enhancer 18. The IS interface board 22 then sends the input signal to the W-input 12 of the probe interface 29 and receives the sample response signal from the probe interface 29 through one of the other probe connections depending on what type of measurement is being performed. If the matrix switch 26 is being used, the probe interface 29 is connected to the matrix switch 26. The matrix switch 26, controlled by the computer 10 through the DI/O-24 interface 11, routes the probe inputs to any one of multiple probe interfaces on the matrix switch 26 selected by the computer 10. This enables measurements to be taken from several samples or at several locations on a single sample automatically and the responses to be routed back to the probe interface 29 of the IS interface board 22.

The response signal is then routed from the IS interface board 22 probe interface 29 to the high-Z preamp 20 and from there to the measurement section 15 of the SR-810 14. The input signal is also sent through one or more load resistors on the IS interface board 22 to determine the sample current. This load resistor response is also routed through the high-Z preamp 20 and then to the measurement section 15 of the SR-810 14.

Computer 10

The computer 10 controls and coordinates the other IS system components in sending signals of known phase and magnitude to a sample being characterized and measuring the response signal across the probe. The computer 10 controls the SR-810 14 through an IEEE-488 bus 9, and controls the other IS system components through a DI/O-24 bus 11.

The computer 10 controls the voltage and phase of the input signal and the load resistance, and retrieves the measurement data from the measurement section 15 of the SR-810 14. The computer 10 then calculates the real and imaginary components of the impedance measurements of the sample. The known values are the input voltage, Vs, and resistance, Rs. The measured values are the voltage and phase across the input resistance, Vr and Φr, and the voltage and phase across the sample, Vz and Φz. The calculated values are the circuit current:

$$Is=(Vr<\Phi r)/(Rs)=(Vr/Rs)<\Phi r$$

and the sample impedance:

$$Zs=(Vz<\Phi z)/Is=(Vz<\Phi r)/[(Vr/Rs)<\Phi r]=Rs\ (Vz/Vr)<\Phi z-\Phi r$$

The computer 10 stores the known, measured and calculated values and uses them in analysis and display routines to determine the condition of the sample being characterized, and to convey that information to the operator.

SR-810 Lock-in Amplifier 14

The SR-810 14 is an off-the-shelf lock-in amplifier that is capable of generating sine and TTL signals from 10 mHz to 100 kHz and of making voltage and phase measurements in reference to an internally or externally generated signal. The SR-810 14 also has the capability of implementing different time constants, discrete resolution and filtering options. In this application the two primary components of the SR-810 14 are the signal generation section 13 and the measurement section 15. The signal generation section 13 is controlled by the computer 10 to generate a sine wave of a specific magnitude and phase. This signal is either directed to the IS interface board 22 or to the IS DC modulated signal enhancer 18. The response signal from the sample is received from the high-Z preamp 20 of the IS interface board 22. By knowing the phase of the input signal, the SR-810 14 can lock-in on the response signal and measure the magnitude and phase difference of the response.

IS DC Modulated Signal Enhancer 18

The IS DC modulated signal enhancer 18 is used in the IS system 8 when a DC bias or gain needs to be added to the AC signal from the SR-810 14 signal generation section 13. The IS DC modulated signal enhancer 18 can be separated into two primary sections: the voltage generation section 17 and the programmable sine modulated voltage section 19. The voltage generation section 17 generates the rail voltages needed by the programmable sine modulated voltage section 19 from the power source for the DC modulated signal enhancer 18. The programmable sine modulated voltage section 19 is controlled by the computer 10 via a 50-pin IDC connector 144. The programmable sine modulated voltage section 19 amplifies the SR-810 14 input signal by a gain of 1, 2 or 5 V/V and generates a computer selected DC bias signal which is added to the amplified signal and the combined signal is amplified by a fixed gain of 5 V/V. The resulting signal is output to the IS interface board 22.

Voltage Generation Section 17

The voltage generation section 17 of the IS DC modulated signal enhancer 18 produces high and low DC voltages that are used by the programmable sine modulated voltage section 19. Input power for the voltage generation section 17 is supplied via the AC line connection to a Cor-Com module 42. The Cor-Com module 42 molex power connector 49 connects to the power connector 51 of the IS DC modulated signal enhancer 18. An indicator light 47 signals that power is being supplied. Capacitors 41, 43 and 45 are used to filter the high frequency noise from the power entering the board at connector 51.

Low Voltage Section

The low voltage section receives power from the Cor-Com module 42 that is channeled to a power transformer 44 (Stancor LB656) which is switched to produce 24 VRMS output to a bridge rectifier 46. Capacitors 41, 43 and 45 are attached to the lines between the Cor-Com module 42 and the power transformer 44 to bypass high-frequency noise from the primary of the power transformer 44.

The bridge rectifier 46 produces a positive and negative rectified pulsing DC voltage. The positive DC voltage is filtered by a pi filter consisting of two low-capacitance capacitors 48, 50 and an inductor 52. The positive voltage is then filtered by a pair of capacitors 54, 56 which are bypassed by a low-capacitance capacitor 58. This filtered positive DC voltage is the input rail voltage for a +12V linear voltage regulator 60 (National Semiconductor LM7812). The output of the voltage regulator 60 is filtered by capacitors 66, 68 and provides the +12V rail voltage 80 for the programmable sine modulated voltage section 19. Diodes 62 and 64 are used to limit the voltage differential across the voltage regulator 60 and to protect the voltage regulator 60 from short circuits at the output 80.

The filtered output of voltage regulator 60 is also the input voltage to a +5 volt linear voltage regulator 70 (National Semiconductor LM78L05). The output of the +5V voltage regulator 70 is filtered by capacitors 76, 78 and provides the +5V rail voltage 82 for the programmable sine modulated voltage section 19. Diodes 72 and 74 are used to limit the voltage differential across the voltage regulator 70 and to protect the voltage regulator 70 from short circuits at the output 82.

The negative DC voltage from the bridge rectifier 46 is filtered by a pi filter consisting of two low-capacitance capacitors 88, 90 and an inductor 92. The negative voltage is then filtered by a pair of capacitors 94, 96 which are bypassed by a low-capacitance capacitor 98. This filtered negative DC voltage is the input rail voltage for a −12 V linear voltage regulator 100 (National Semiconductor LM7912). The output of the voltage regulator 100 is filtered by capacitors 106, 108 and provides the −12V rail voltage 84 for the programmable sine modulated voltage section 19. Diodes 102 and 104 are used to limit the voltage differential across the voltage regulator 100 and to protect the voltage regulator 100 from short circuits at the output 84.

The filtered output of voltage regulator 100 is also the input voltage to an adjustable negative voltage regulator 110 (National Semiconductor LM337T). The output of the adjustable negative voltage regulator 110 is biased by a set resistor 112 connected to the adjustment pin to provide −6.2V output and has a load resistor 116 to provide a minimum output current path. The output of the adjustable negative voltage regulator 110 is filtered by capacitor 114 and provides the −6.2V rail voltage 124 for the programmable sine modulated voltage section 19. Diodes 118 and 120 are used to limit the voltage differential across the voltage regulator 110 and to protect the voltage regulator 110 from short circuits at the output 124.

High Voltage Section

The high voltage section receives power from the Cor-Com module 42 that is channeled to a power transformer 226 (Stancor LB524) which is switched to produce 56 VRMS output to a bridge rectifier 228. Capacitors 41, 43 and 45 are attached to the lines between the Cor-Com module 42 and the power transformer 226 to bypass high-frequency noise from the primary of the power transformer 226.

The bridge rectifier 228 is configured in a single ended configuration producing a high pulsing DC voltage. The high DC voltage is filtered by a pi filter consisting of two low-capacitance capacitors 236, 240 and an inductor 238. The high DC voltage is then filtered by two capacitors 230, 232 which are bypassed by a low-capacitance capacitor 234.

The filtered DC voltage is then fed to a high voltage NPN transistor 244 (SK3104A) and a high voltage NPN pass transistor 246 (Motorola TIP-47) in a Darlington configuration. A resistor 242 connects the collector and base of the first transistor 244, and a resistor 247 connects the base and emitter of the second transistor 246. These two transistors 244, 246 stand-off the high voltage and supply the rail voltage input to an adjustable positive high voltage regulator 254 (National Semiconductor LM317HVT) through a ballast resistor 252. The positive voltage regulator 254 has no ground connection and thus operates in a floating mode, enabling it to handle hundreds of volts as long as the voltage differential does not exceed the specified limit for the regulator. A zener diode 248 and diode 250 limit the voltage differential across the positive voltage regulator 254. The resistors 256, 260 and potentiometer 258 control the high voltage adjustment pin of the voltage regulator 254, and a capacitor 266 filters this adjustment voltage. A load resistor 262 provides the minimum load current to keep the positive voltage regulator 254 stable during a minimum output current condition. The output of the positive voltage regulator 254 is filtered by capacitor 268 in series with resistor 264. This regulated high DC voltage provides the +60V rail voltage 282 for the programmable sine wave modulated section 19.

The output of the positive voltage regulator 254 is also filtered by capacitor 270 and input to a second adjustable positive high voltage regulator 272 (National Semiconductor LM317HVT). A potentiometer 274 controls the voltage adjustment pin of the voltage regulator 272, and a capacitor 276 filters this adjustment voltage. A load resistor 278 provides the minimum load current to keep the positive voltage regulator 272 stable during a minimum output current condition. Diode 280 limits the voltage differential across the second adjustable voltage regulator 272. The output of the second adjustable high voltage regulator 272 provides the +20V rail voltage 284 for the programmable sine wave modulated section 19.

Programmable Sine Modulated Output Section 19

The programmable sine wave modulated output section 19 of the IS DC modulated signal enhancer 18 is controlled by the computer 10 through the DI/O-24 interface 11 connected by a 50-pin IDC connector 144. Twelve channels of the interface 11 are used to set a bit condition on a digital to analog convertor (DAC) 146 (Burr-Brown DAC-80P-CBI-V). The AC input signal from the SR-810 14 enters through connector 170. A summing amplifier amplifies the AC signal by a selectable gain of 1, 3 or 5 V/V and sums the amplified AC signal with the DC signal from the DAC 146. The summed signal enters an output stage with a set gain of 5 V/V and the amplified signal is routed to output connector 224 which is connected to the IS interface board 22. The output signal after gain and bias modification must have the same phase or a known difference from the phase of the input signal so that any phase difference in the response signal from the sample under test can be attributed to the sample under test.

At power up all of the lines of the DAC 146 are pulled low by the +5V rail voltage 82. The DAC 146 is configured to operate in the unipolar mode with a 0 to 10 V output range with 12 bit resolution. Potentiometer 156 and resistor 158 control the balance adjustment of DAC 146 to set the low voltage setting. Potentiometer 162 and resistor 160 control the gain adjustment of DAC 146 to set the high voltage setting. The balance and gain adjustments are connected to the +12V rail voltage 80 and the −12V rail voltage 84 which are filtered by capacitors 152, 154 and 164. Capacitors 148 and 150 are also used to filter the −12V rail voltage 84 to the DAC 146.

The 12 input logic lines from connector 144 enable the definition of 4,096 states. The following lines from the computer 10 are connected to the IDC connector 144 for logic control of the DAC 146:

| 50-pin IDC connector 144 | DAC 146 pin number |
|---|---|
| Pin 1 CPC7 | Pin 1 MSB |
| Pin 3 CPC6 | Pin 2 |
| Pin 5 CPC5 | Pin 3 |
| Pin 7 CPC4 | Pin 4 |
| Pin 9 CPC3 | Pin 5 |
| Pin 11 CPC2 | Pin 6 |
| Pin 13 CPC1 | Pin 7 |
| Pin 15 CPC0 | Pin 8 |
| Pin 17 CPB7 | Pin 9 |
| Pin 19 CPB6 | Pin 10 |
| Pin 21 CPB5 | Pin 11 |
| Pin 23 CPB4 | Pin 12 LSB |
| Output condition: | 000000000000 = +10.0 VDC |
| | 100000000000 = +5.0 VDC |
| | 111111111111 = 0.0 VDC |

This results in a 10V DC output range divided by 4,096 possible states providing steps of 2.441 mV per bit. The output of the DAC 146 is filtered by capacitor 168 in series with resistor 166 and routed to the reference input of summing amplifier 182 (INA118P).

The input signal from the SR-810 enters through connector 170 and is conditioned by resistors 172, 174 and 176 and routed to the noninverting input of the summing amplifier 182. The inverting input of summing amplifier 182 is tied to ground. The summing amplifier is connected to both the +20V rail voltage 284, which is filtered by capacitors 178 and 180, and the −12V rail voltage 84, which is filtered by capacitors 192 and 194 to provide the necessary output voltage range. The noninverting input signal is amplified by the summing amplifier according to the position of switches 188 and 190 as follows:

| SW 188 | SW 190 | Gain |
|--------|--------|------|
| Open   | Open   | 1 V/V |
| Close  | Open   | 2 V/V |
| Open   | Close  | 5 V/V |

When switch 188 is closed a circuit is created through resistor 184 and when switch 190 is closed a circuit is created through resistor 186. The amplified AC signal input to the noninverting input of summing amplifier 182 is summed with the DC bias from the DAC 146 which is input through the reference pin of the summing amplifier 182. The resultant signal is input to the noninverting input of the programmable gain output stage amplifier 200 (OPA544T).

The programmable gain output stage amplifier 200 has a fixed gain of 5 V/V. The amplifier 200 is connected to the −6.2V rail voltage 124, filtered by capacitors 208 and 210, and the +60V rail voltage 282, filtered by capacitors 202 and 204, to provide the necessary voltage range for the output signal. Resistors 206, 196 provide a feedback path and control the gain of amplifier 200. The output of the output stage amplifier 200 is protected with a pair of fast recovery diodes 212, 214. The DC modulated voltage output from amplifier 200 is filtered by an inductor 218 in parallel with a resistor 220, shunted by a resistor 216, and routed to a board mounted BNC connector 224 that connects to the working probe connector of the IS Interface Board 22.

IS Interface Board 22

The IS interface board 22 can be divided into three primary sections: logic & switching 21, high-Z preamp 20, and power supply 23. The IS interface board is controlled by the computer 10 via the DI/O-24 bus 11 which connects at connector 308. The signal to be applied to the sample under test enters through the sine-in, W, input 342. This signal comes from either the SR-810 14 signal generation section 13 without a DC bias or from the IS DC modulated signal enhancer 18 programmable sine modulated output section 19 after gain and/or DC bias modification. The signal ground from the SR-810 14 is input through the control, C, connector 340. The computer 10 controls the logic & switching section 21 to select the probe contacts which are routed back to the SR-810 14 measurement section 15 through the high-Z preamp 20. The input, measured and known values will be used by the IS software to calculate the impedance of the sample under test for the applied signal.

The power supply section 23 simply takes the power input to the board and creates the rail voltages required by the logic & switching section 21 and the high-Z preamp section 20.

The logic & switching section 21 controls the signals that are put on the probe interface jacks. There are two sets of probe interface jacks depending on whether or not the matrix switch 26 is being used. The probe interface jacks are:

| Matrix 26 | | | |
|--------|-----|-----|-------------|
| Signal | w/  | w/o | Description |
| W      | 348 | 356 | working input, 0 to 100 kHz sine wave (SR-810 component) with 0 to +50 V bias (IS DC modulated signal enhancer component) |
| A      | 352 | 360 | channel A |
| B      | 354 | 362 | channel B |
| C      | 350 | 358 | signal ground from SR-810 |

Switches 398, 400 are used to select the matrix switch 26. The computer sets switches 398, 400 using pins 324, 326, respectively, of the of interface connector 308 and the measurement logic 392.

The input signal to the logic & switching circuit enters at connector 342 and is routed to the probe interface W-input, 348 or 356, to be applied to the sample under test. The appropriate response channels depend on whether a two, three or four probe measurement is being made. Switches 394 and 396 are used to select the measurement type. The computer sets switches 394, 396 using pins 320, 322, respectively, of the interface connector 308 and the measurement logic 392 as follows:

| pin 320 | pin 322 | Measurement Type |
|---------|---------|------------------|
| 0       | 0       | 4 pole |
| 1       | —       | 3 pole |
| 0       | 1       | 2 pole |

In a 2-pole measurement the response is taken between probe connectors W and C, in a 3 pole measurement the response is taken between probe connectors B and C, and in a four pole measurement the response is taken between probes A and B.

A voltage and phase reading is also taken across a known load resistor in order to determine the signal current. There are five load resistors 381–385 which are selectable using relays 371–375, respectively, which are controlled by computer 10 using interface pins 311–315, respectively. There could be more or less load resistors depending on the application. The relays can be activated to put the resistors 381–385 into the measuring circuit individually or in parallel combinations. Load resistance ranges can be tailored to fit specific applications by adjusting the resistor values connected to the relays. Additional load resistors and relays could be added with the associated control logic if required by the application. The signal from pins 311–315 goes through the load resistor logic 390 which closes the appropriate switches 371–375. The switches 371–375 are normally in the open circuit position. When activated the switches, 371–375, put the associated load resistor, 381–385, in the signal path. When more than one switch is activated the load resistors are in parallel in the circuit.

High-Z Preamp 20

Figure 3A:
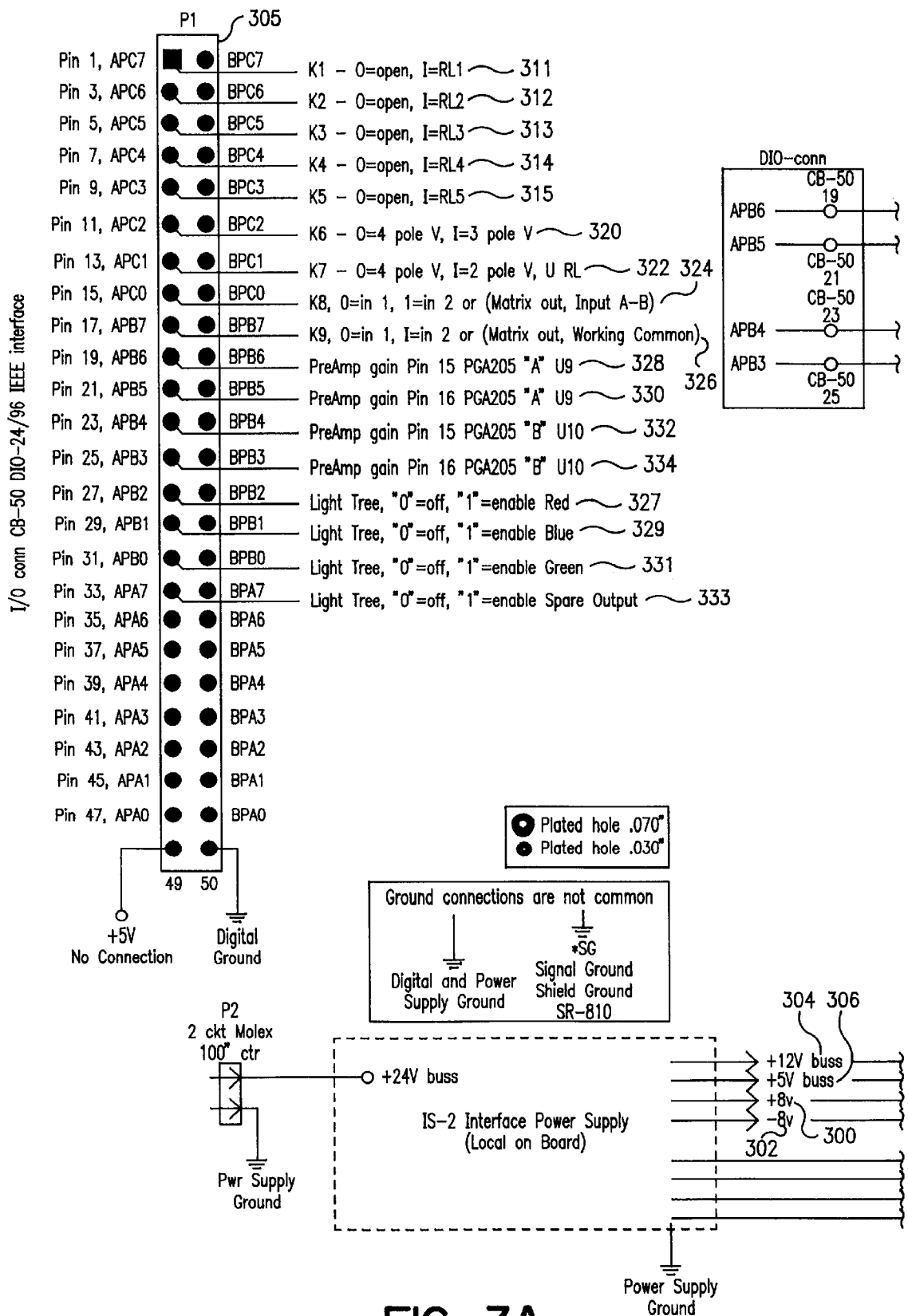
FIG. 3 is a top level circuit diagram of the IS interface board.
Figure 3B:
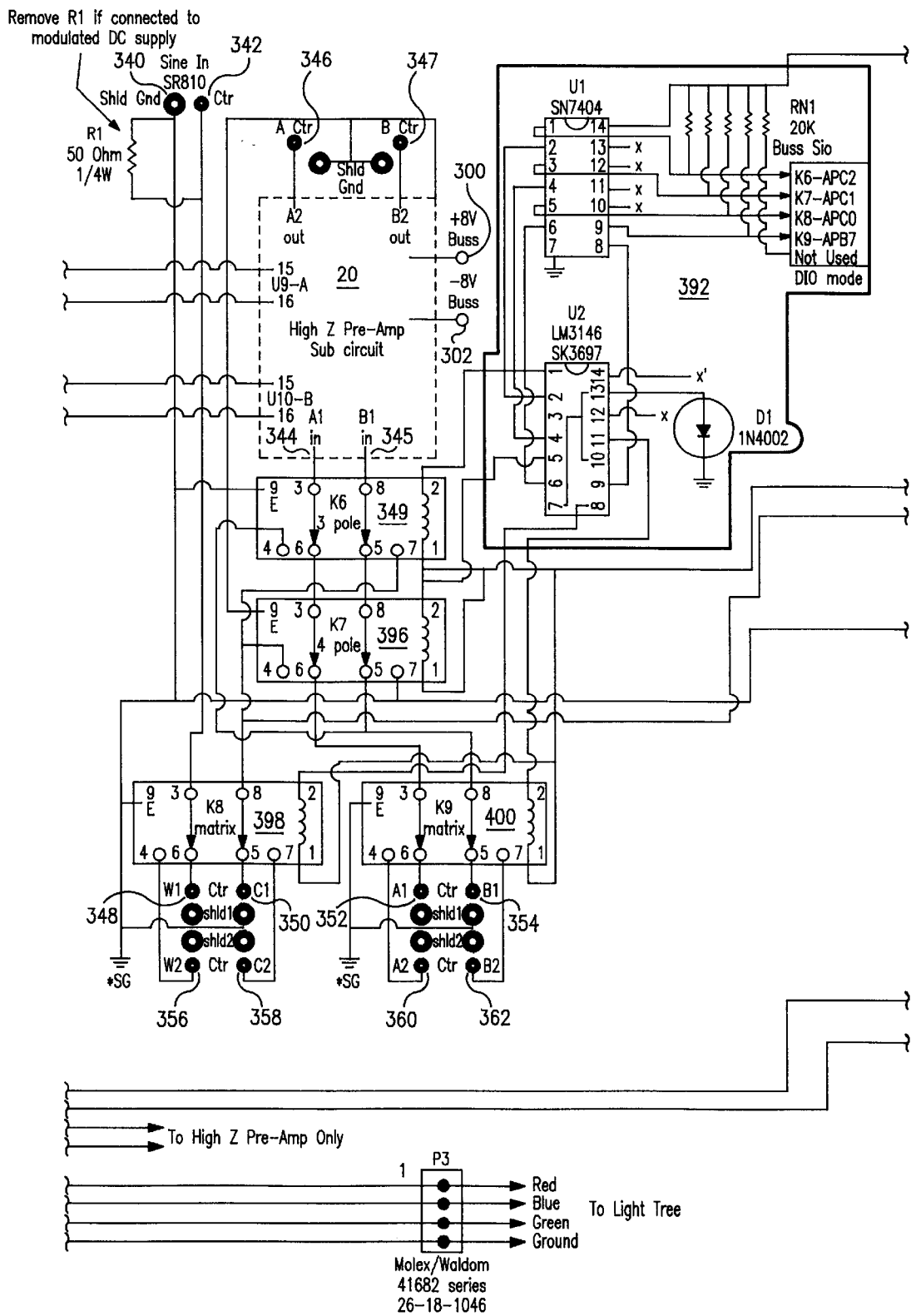
Figure 3C:
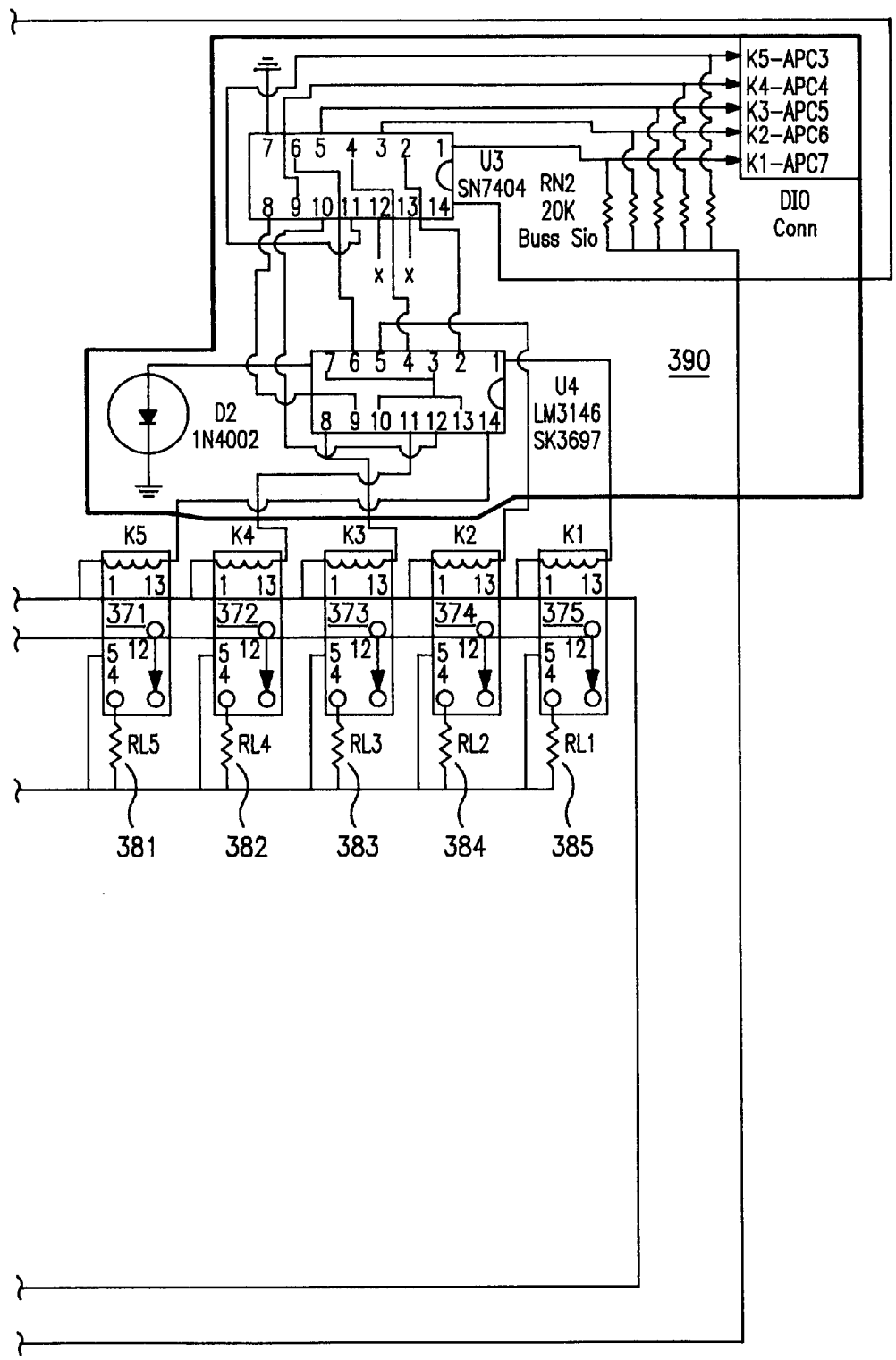
Figure 4A:
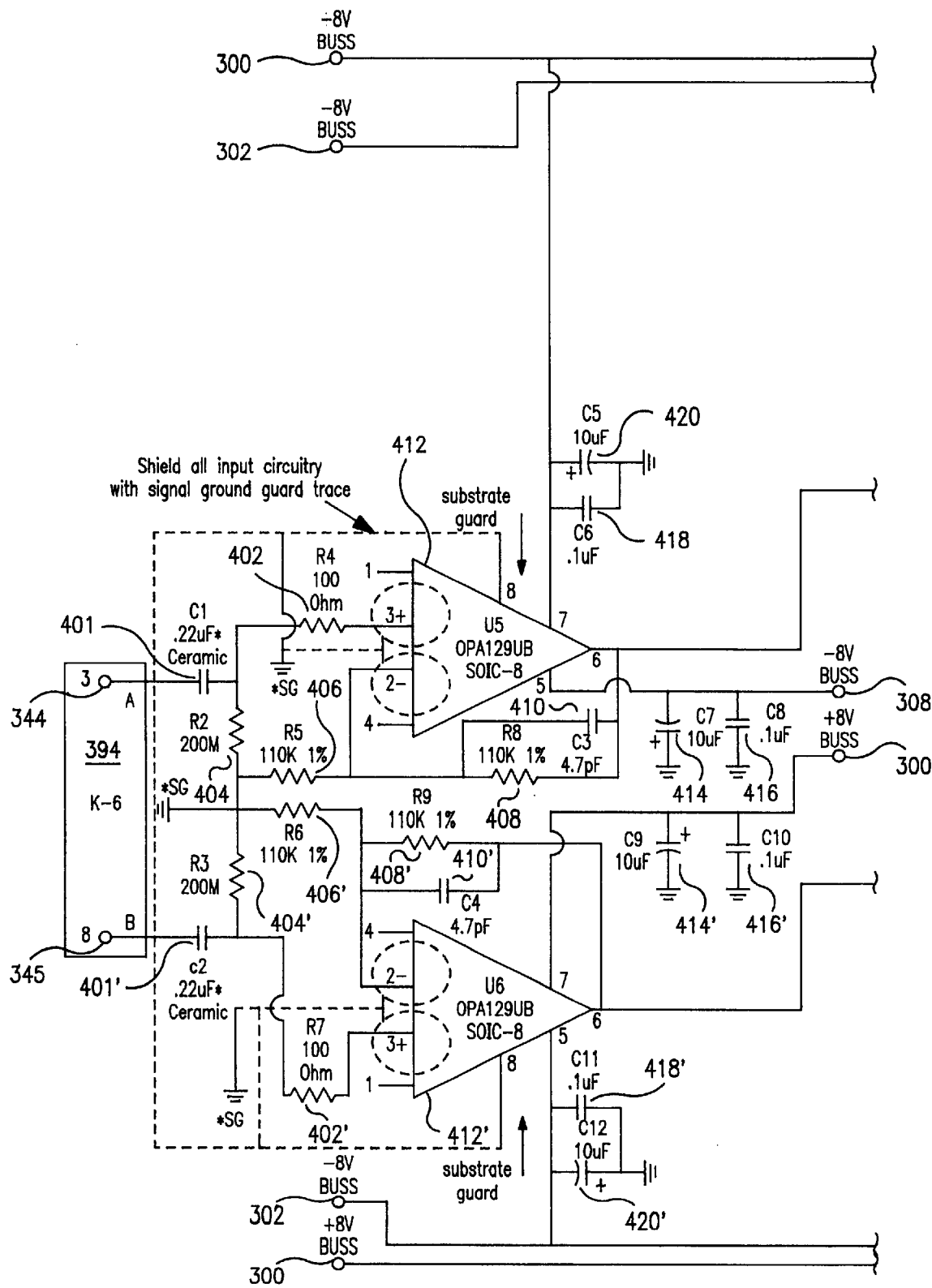
FIG. 4 is a circuit diagram of the high-impedance pre-amp of the IS interface board.
Figure 4B:
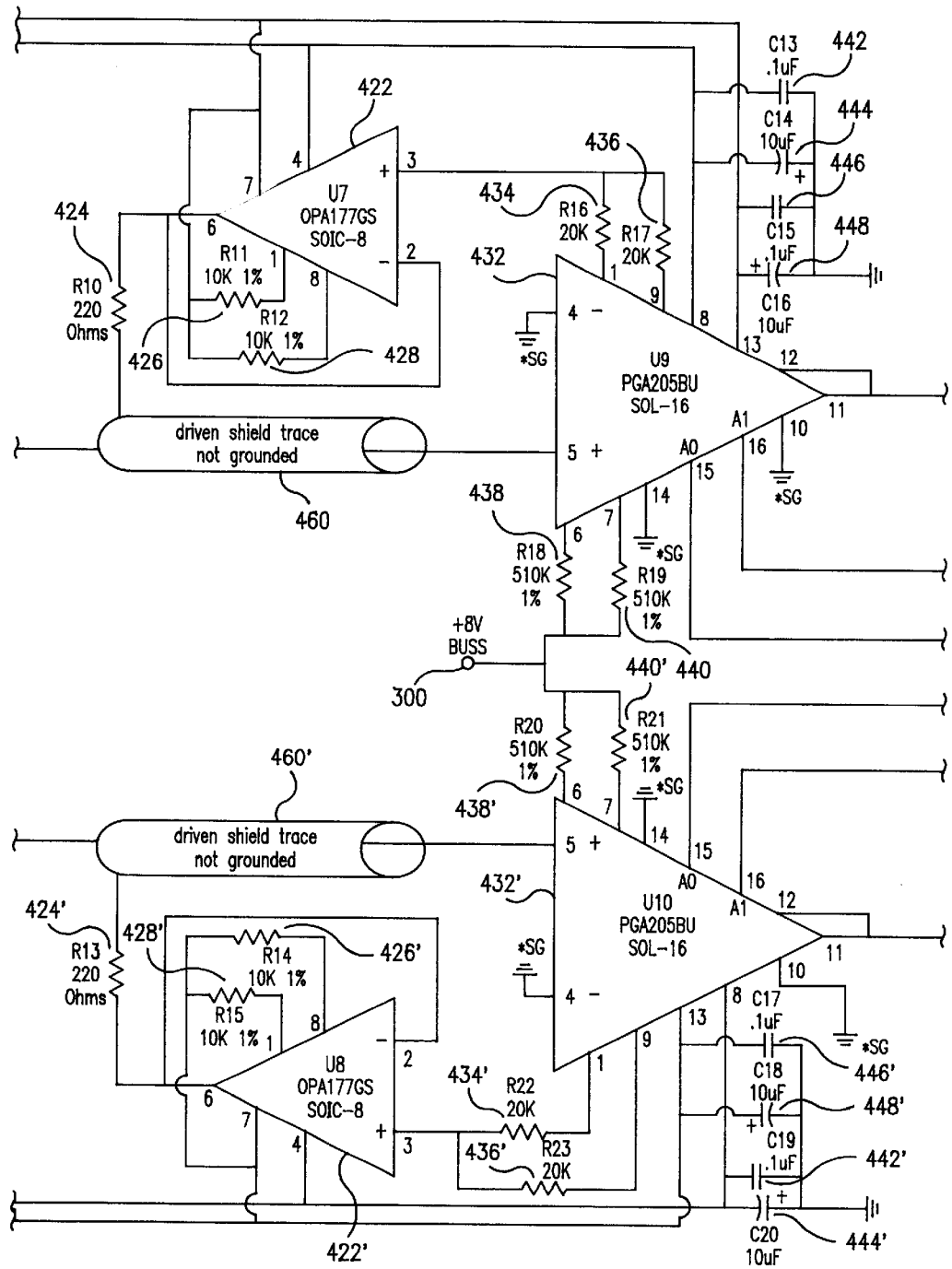
Figure 4C:
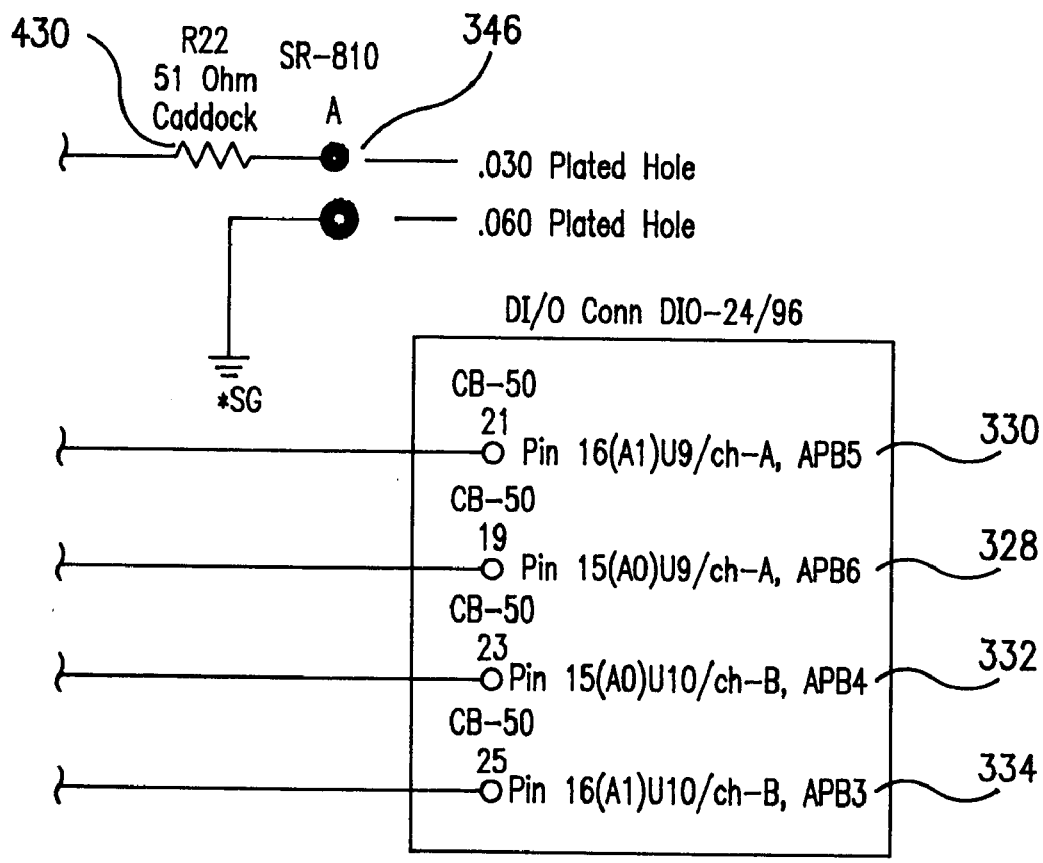

The outgoing signal from the logic & switching section 21 is sent to the high-Z preamp 20 through the A-input 344 and the B-input 345 of switch 394 (FIG. 3 and FIG. 4). The high-Z preamp 20 improves isolation between the probe interface and the system and provides improved response signal resolution when measuring very resistive materials. Both the A-input 344 and the B-input 345 go through the same amplification circuit as shown in FIG. 4. The following description will use an unprimed number (e.g., 412) to refer to an A-signal processing component and the same number primed (e.g. 412') to refer to the same B-signal processing component.

The input stage is a linear operational amplifier 412, 412' (Burr-Brown OPA129UB) set to have a unity gain. The input signal enters through capacitor 401, 401' to isolate the DC signal and signal noise and is routed through resistor 402, 402' to the noninverting input of the input stage amplifier 412, 412' which has shunt resistor 404, 404' tied to signal ground. The inverting input of the input stage amplifier 412, 412' is tied to signal ground through resistor 406, 406'. A resistor 408, 408' and capacitor 410, 410' create a signal roll off in the input stage amplifier 412, 412' above 160 kHz. Since the signal range only extends to 100 kHz this helps prevent parasitic noise from being amplified through the high-Z preamp 20. The input amplifier 412, 412' is tied to a +8V rail voltage 300 and a −8V rail voltage 302 which are both generated by the power supply section 23. Capacitors 414, 414' and 416, 416' filter the positive voltage input and capacitors 418, 418' and 420, 420' filter the negative voltage input.

The output of the input stage is routed through a shielded trace 460, 460' to a non-latching programmable gain output stage 432, 432' (Burr-Brown PGA205BU). The gain of the output stage 432, 432' can be set during operation to 1, 2, 4 or 8 V/V and each channel (A or B) can be set independently. This can be used to amplify the response signal above the noise range of the SR-810 lock-in amplifier 14 to enable its measurement section 15 to lock-in on the response signal faster. The independent control of A and B channels can be used to prevent the SR-810 lock-in amplifier 14 from having to autorange during a reading cycle when there is more than one order of magnitude voltage difference between the two probe response signals. The gain control settings are made using a pair of data lines 328, 330 for the A-input and 332, 334 for the B-input from the computer 10 interface 308. The preamp gain settings for channel A are:

| pin 328 | pin 330 | Channel A Gain |
|---------|---------|----------------|
| 0 | 0 | 1 |
| 1 | 0 | 2 |
| 0 | 1 | 4 |
| 1 | 1 | 8 | and for channel B are:

| pin 332 | pin 334 | Channel B Gain |
|---------|---------|----------------|
| 0 | 0 | 1 |
| 1 | 0 | 2 |
| 0 | 1 | 4 |
| 1 | 1 | 8 |

The connecting trace from the input stage amplifier 412, 412' to the output stage amplifier 432, 432' is shielded by a guard trace 460, 460'. The guard trace 460, 460' is continuous from the output pin of the input stage 412, 412' to the input pin of the output stage 432, 432'. The guard shield trace is actively driven by another operational amplifier 422, 422' used as a voltage follower (Burr-Brown OPA177GS). This configuration provides virtually no voltage difference over the trace, thus virtually no current flow and very high impedance giving the best signal-to-noise ratio at the output to the SR-810 14 at connector 346 for output-A and connector 347 for output B.

The input signal to the output stage amplifier 432, 432' is used to control the guard shield driver 422, 422'. The output stage amplifier 432, 432' sends an input signal through resistors 434, 434' and 436, 436' to the noninverting input of the guard shield driver 422, 422'. The guard shield driver 422, 422' is tied to the +8V rail voltage 300 and −8V rail voltage 302 directly and through resistors 426, 426' and 428, 428'. The output of the guard shield driver 422, 422' is routed through the resistor 424, 424' to the guard trace 460, 460' which is set to match the voltage on the trace between the output of the input stage 412, 412' and the input of the output stage 432, 432'.

The output stage 432, 432' is tied to the +8V rail voltage 300 through resistors 438, 438' and 440, 440'. Capacitors 442, 442' and 444, 444' are used to filter the −8V rail voltage 302 and capacitors 446, 446' and 448, 448' are used to filter the +8V rail voltage 300. The output is sent to the SR-810 measurement section 15 through a 50-ohm resistor 430, 430' to match the input impedance of the SR-810 14. The A-response signal is output at connector 346 and the B-response signal is output at connector 347.

IS Matrix Switch 26

Figure 5A:
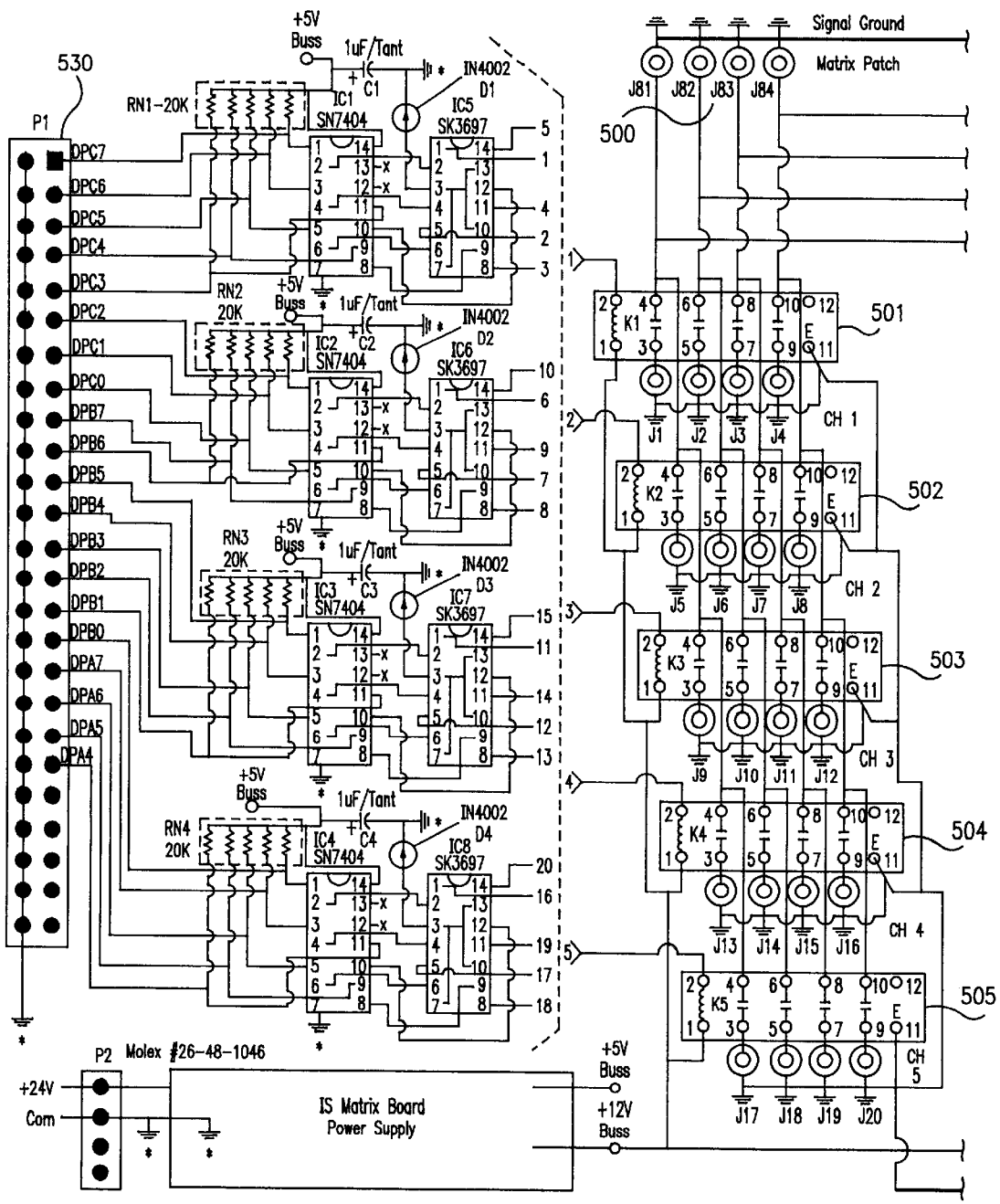
FIG. 5 is a circuit diagram of the matrix switch.
Figure 5B:
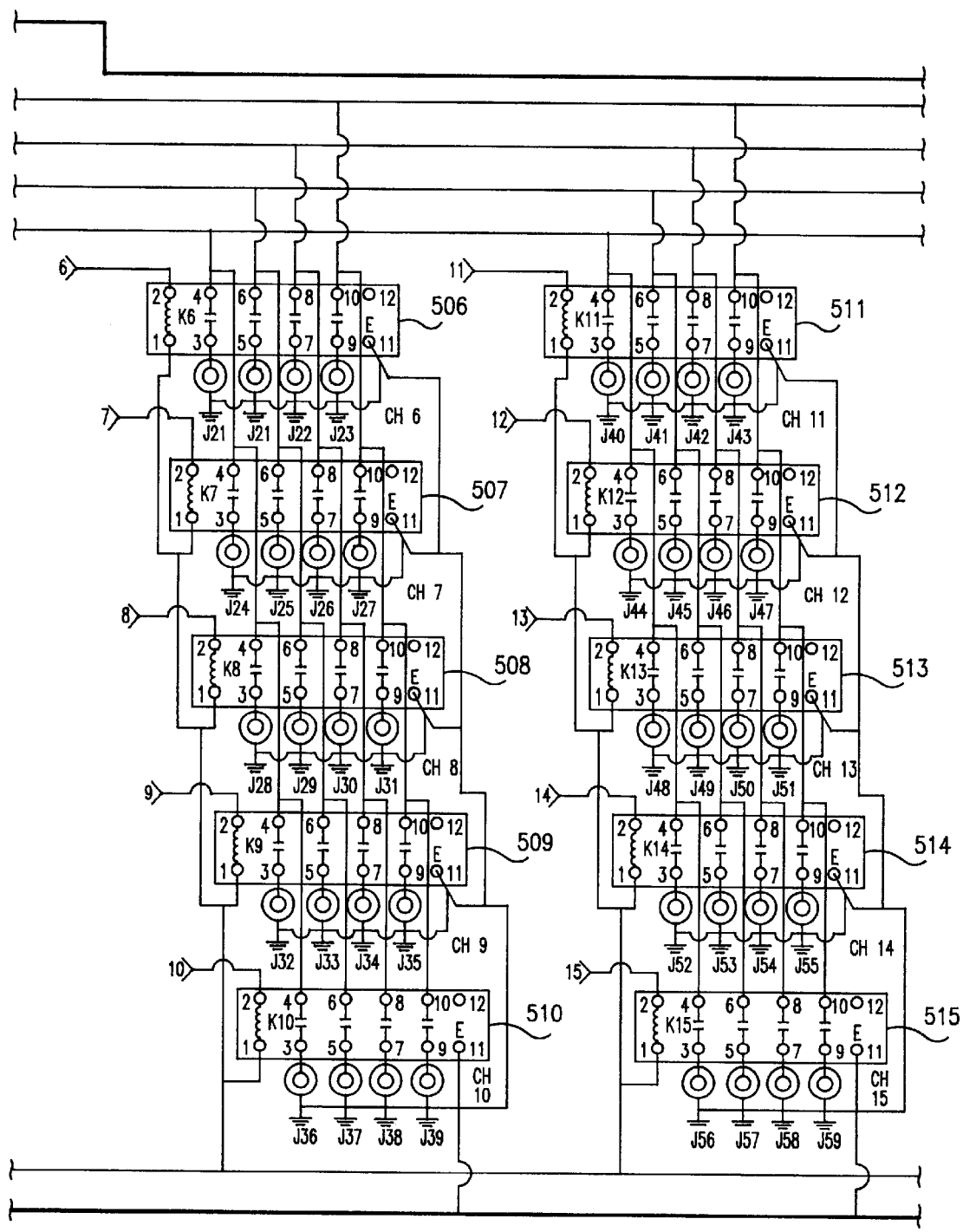
Figure 5C:
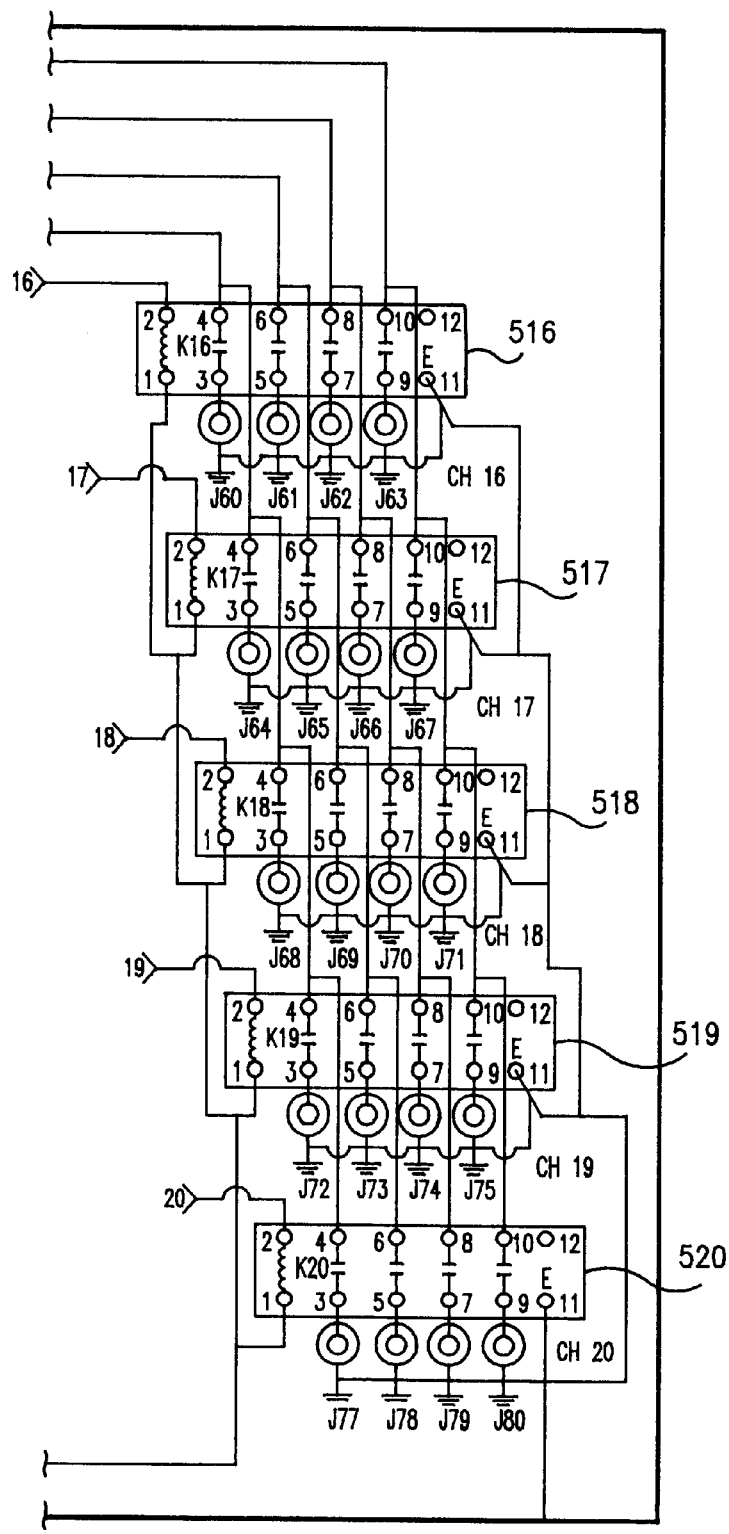

The IS matrix switch 26 allows measurements to be made over multiple samples or at multiple positions on a single sample. The current implementation allows up to twenty probes to be hooked up to the matrix switch 26 as shown in FIG. 5. The output probe connectors 356, 358, 360, 362 from the IS interface board 22 logic & switching section 21 are connected to the 4-connector matrix patch 500 of the matrix switch 26. The computer 10 interfaces with the matrix switch 26 through the DI/O interface 11 with a 50-pin connector 530. Twenty lines of the connector are used to select one of the 4-connector probe interfaces 501–520. The signals from the matrix patch 500 are sent to the selected probe interface, one of 501–520, and the response signals are routed back to the IS interface board 22 to go through the high-Z preamp 20 and on to the measurement section 15 of the SR-810 14.

The matrix switch basically consists of two sections: power supply 27 and logic and switching 25. The power supply section takes the power supplied to the matrix switch board 26 and generates the +5V and +12V rail voltages required by the logic and switching section 25. The logic and switching section 25 is basically an extension of the IS interface board 22 giving the IS system 8 access to up to 20 different probes 501–520 connected to the matrix switch 26 as opposed to one probe connected to the probe interface 29 of the IS interface board 22. Each one of the four connectors of the matrix patch W, A, B, C is routed to the corresponding connector of the selected probe interface. The computer IO controls the probe interface selection through the interface connector 530.

Software

The Impedance Spectroscopy Measurement System software controls the hardware used for collecting impedance data from a solder paste sample. In the preferred embodiment the software has a windows document view user-system interface which provides interactive controls and allows the display of several views simultaneously. A top-level overview of the software functionality is illustrated in FIG. 6, and a sample operator mode screen is shown in FIG. 6A.

Figure 6:
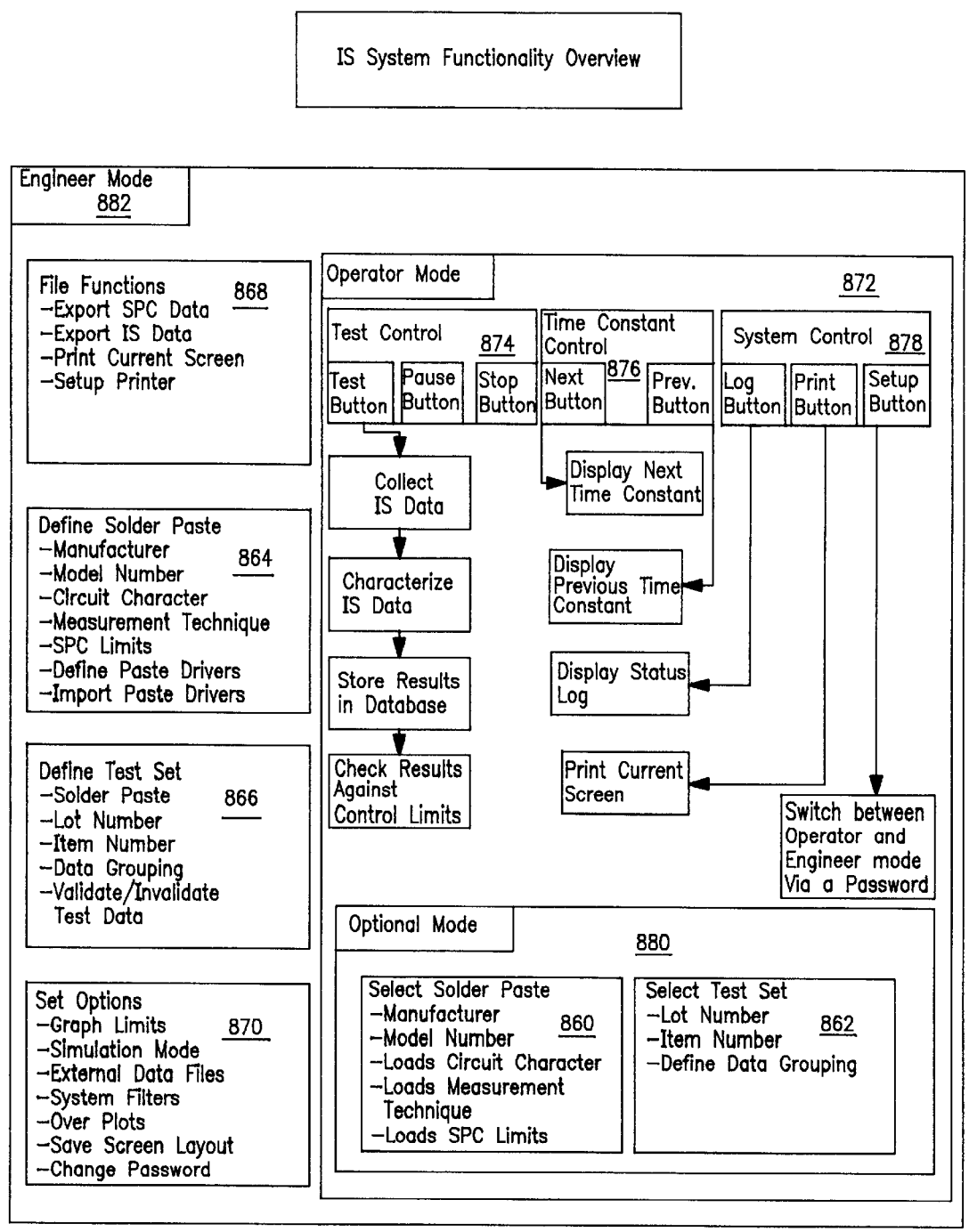
FIG. 6 is a top-level functionality overview of the IS software.
Figures 1, 6A:
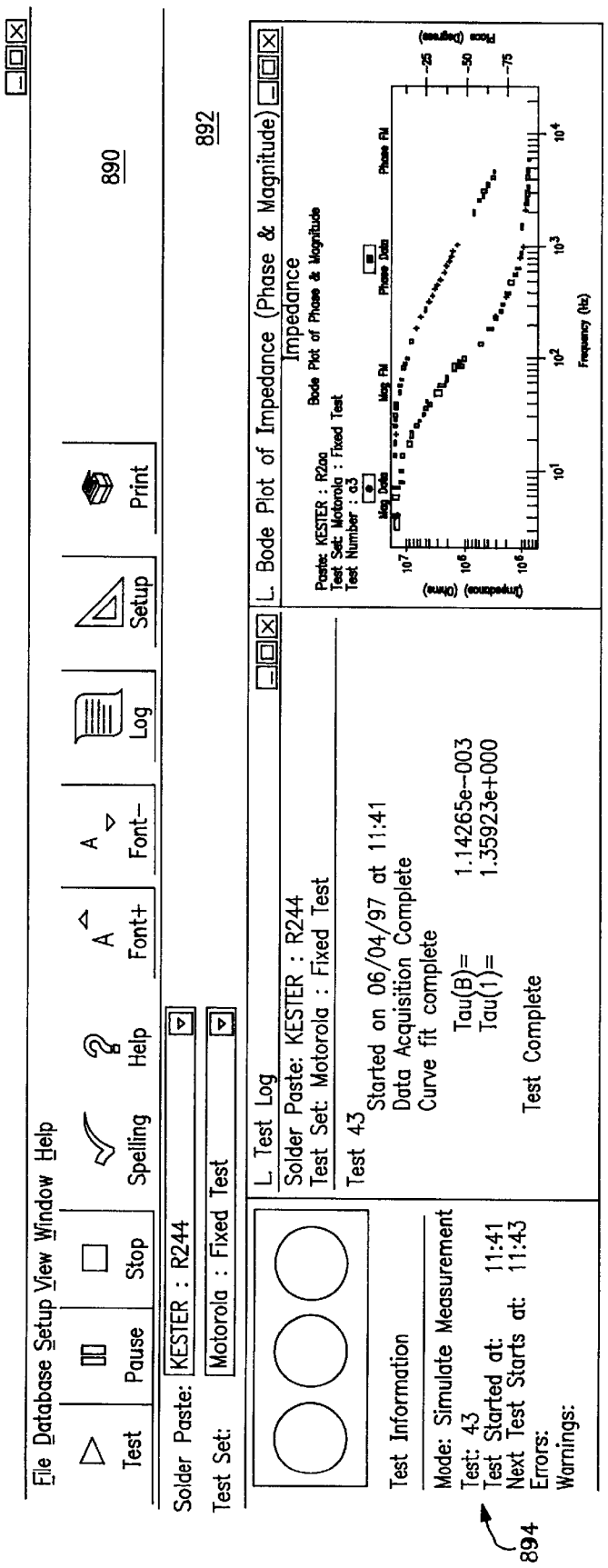
FIG. 6A is a sample operator screen.
Figures 2, 6A:
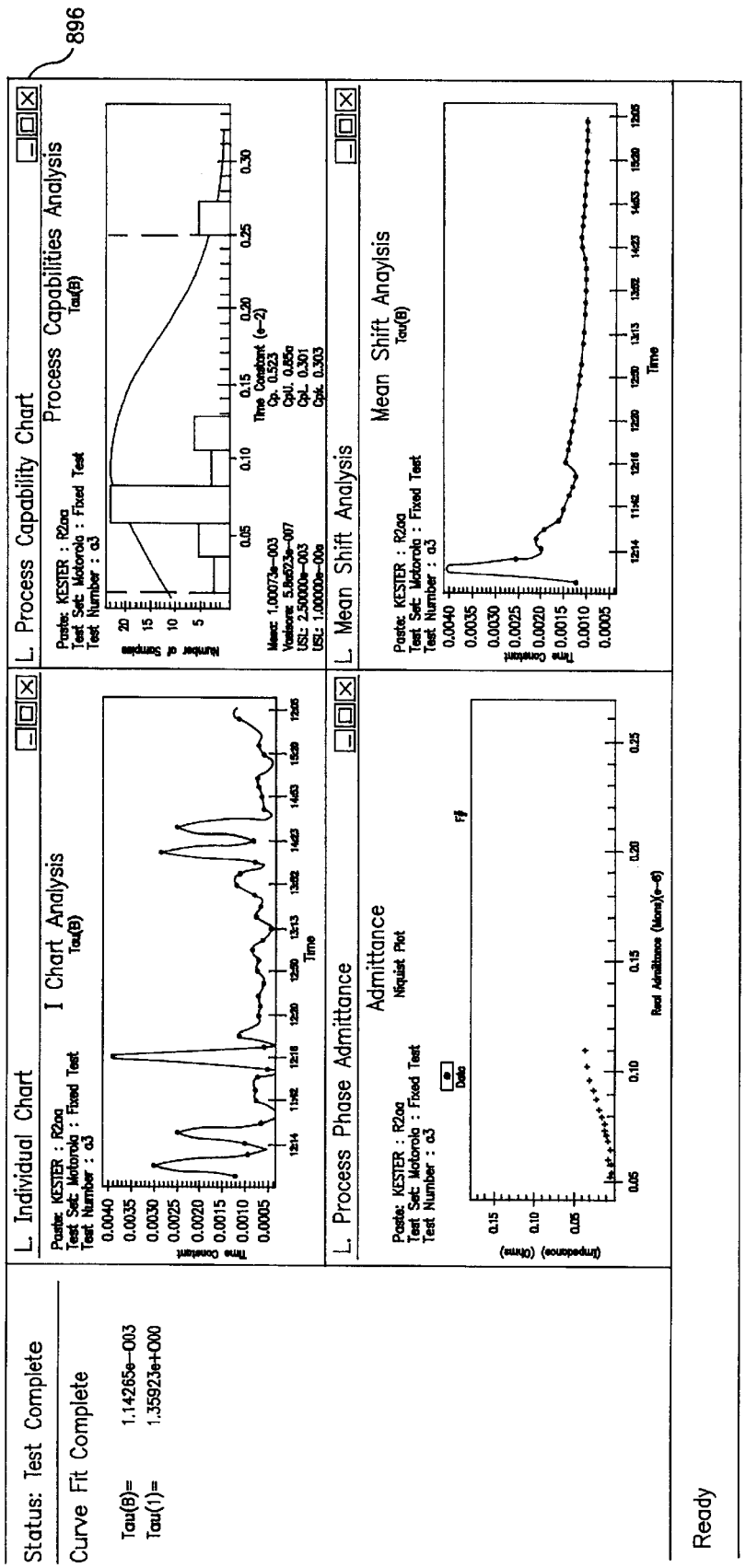

The screen as shown in FIG. 6A has four primary sections. The control bar 890 contains screen activated switches that control the impedance spectroscopy data collection, and the display and printing of information. The solder paste collection bar 892 can be made accessible in operator mode to allow the operator to select solder paste and test set data for different solder pastes. The status section 894 along the right side of the screen displays the test status information for the operator. The remainder of the screen is available for data views 896. These views can be chosen by the operator and are updated automatically during the test collection process.

The software runs in either an operator mode 872 or an engineer mode 882 (FIG. 6). The operator mode limits the functionality of the software so that the operator may not change the database. Engineer mode allows access to the full functionality of the software to let the engineer set the system up for the operator. The functions in the Optional Mode 880 can be made accessible or inaccessible in Operator Mode 872 depending on a setting made from Engineer Mode 882.

The Define Solder Paste function 864 allows the user in engineer mode to define the solder paste parameters in the Solder Paste Table of the database. The information which may be defined within this table includes the manufacturer, model number, equivalent circuit character, measurement technique, and SPC limits. The user can also define or import paste drivers for the solder paste. The manufacturer and model number identify the solder paste record in the database. The circuit character is used to characterize the solder paste.

The Define Test Set function 866 allows the user in engineer mode to define the inspections which will occur on a particular solder paste. The information which may be entered includes the solder paste identifier, lot number, item number, and data grouping. The user may also validate or invalidate test data from this function. A test set may be invalid if it was collected with improper probe connection to the sample or the probe was short circuited during the collection process.

The File Functions function 868 allows the user in engineer mode to export SPC or IS data, to setup the printer and to print data or screens. The Set Options function 870 allows the user in engineer mode to set limits on graphs, modify the simulation, access external data files, select system filters, create over plots, save screen layouts, and to change the engineer mode password.

The Optional Mode 880 functions are always accessible in engineer mode 882 and can be made accessible in operator mode 872 depending on a setting made in engineer mode 882. Select Solder Paste function 860 is an optional mode 880 function that allows the user to select a solder paste from those defined in the Solder Paste Table of the database. Once the user has selected a solder paste, the control parameters for that solder paste are loaded into global memory for test processing. The control parameters which are loaded include the manufacturer, model number, equivalent circuit character, measurement technique, and SPC limits.

The Select Test Set function 866 is also an optional mode 880 function. This function allows the user to select the test set and define the data grouping for a particular lot and item of the selected solder paste.

In operator mode 872, the user has access to test control 874, time constant control 876, system control 878, and may have access to some of the optional mode 880 functions. Test control 874 allows the user to select the test button 880 to begin/continue a test, the pause button 882 to pause a test or the stop button 884 to stop a test. A test entails collecting impedance spectroscopy data over a variety of frequencies, characterizing the data by curve fitting to the equivalent circuit description defined in the solder paste table, storing the parameters from the curve in the database, and checking the results against the control limits. Time Constant Control 876 allows the user to display collected time constants using the next and previous time constant control buttons in order to determine the deviation in time constants between consecutive tests. System control 878 allows the user to display the status log, print the current screen, or to enter a password to switch from operator mode 872 to engineer mode 882.

Figure 7:
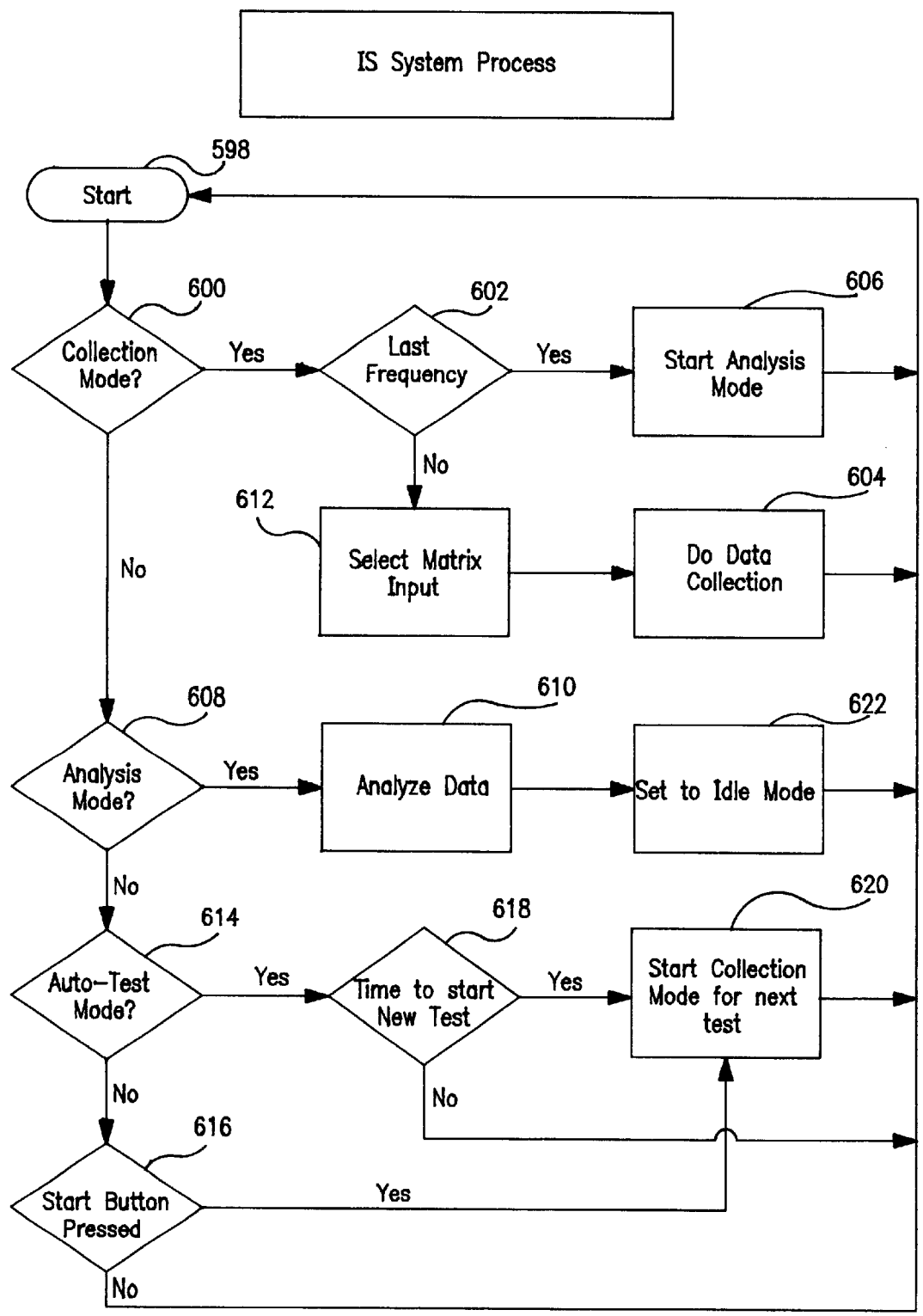
FIG. 7 is a flow diagram of the IS System process.

The IS System Process flow chart for the solder paste measurement system is shown in FIG. 7. This top-level process directs the collection and analysis of data either in a manual mode where the user selects the test start button from the operator screen or auto-test mode where the user has entered times for the system to start tests and the system automatically collects and analyzes the data at the user selected times. The process first checks to determine whether it is in the data collection mode 600. If the system is in the data collection mode the system checks whether the last frequency has been collected 602. If the last frequency has been collected the system switches to analysis mode 606 and returns to the beginning of the process 598. If there are more frequencies to collect then the matrix input is selected 612 and the Data Collection Process 604 (see FIG. 8) is called. When the data is collected control returns to the beginning of the process 598.

If the process is not in the data collection mode the system checks if it is in the analysis mode 608. If the system is in the analysis mode the system calls the Data Analysis Process 610 (see FIG. 14). When the analysis is complete the system switches to idle mode 622 and control returns to the beginning of the process 598.

If the system is not in the analysis mode it checks if it is in the auto test mode 614. If the system is in the auto-test mode it checks if it is time to start a new solder paste test 618. If it is time to start a new test the system switches to start collection mode 620 and returns to the beginning of the process 598. If it is not time to start a new test the system returns to the beginning of the process 598.

If the system is not in the auto-test mode it checks if the start button has been pressed 616. If the start button has been pressed the system switches to start collection mode 620 and returns to the beginning of the process 598. If it is not time to start a new test the system returns to the beginning of the process 598.

Figure 8:
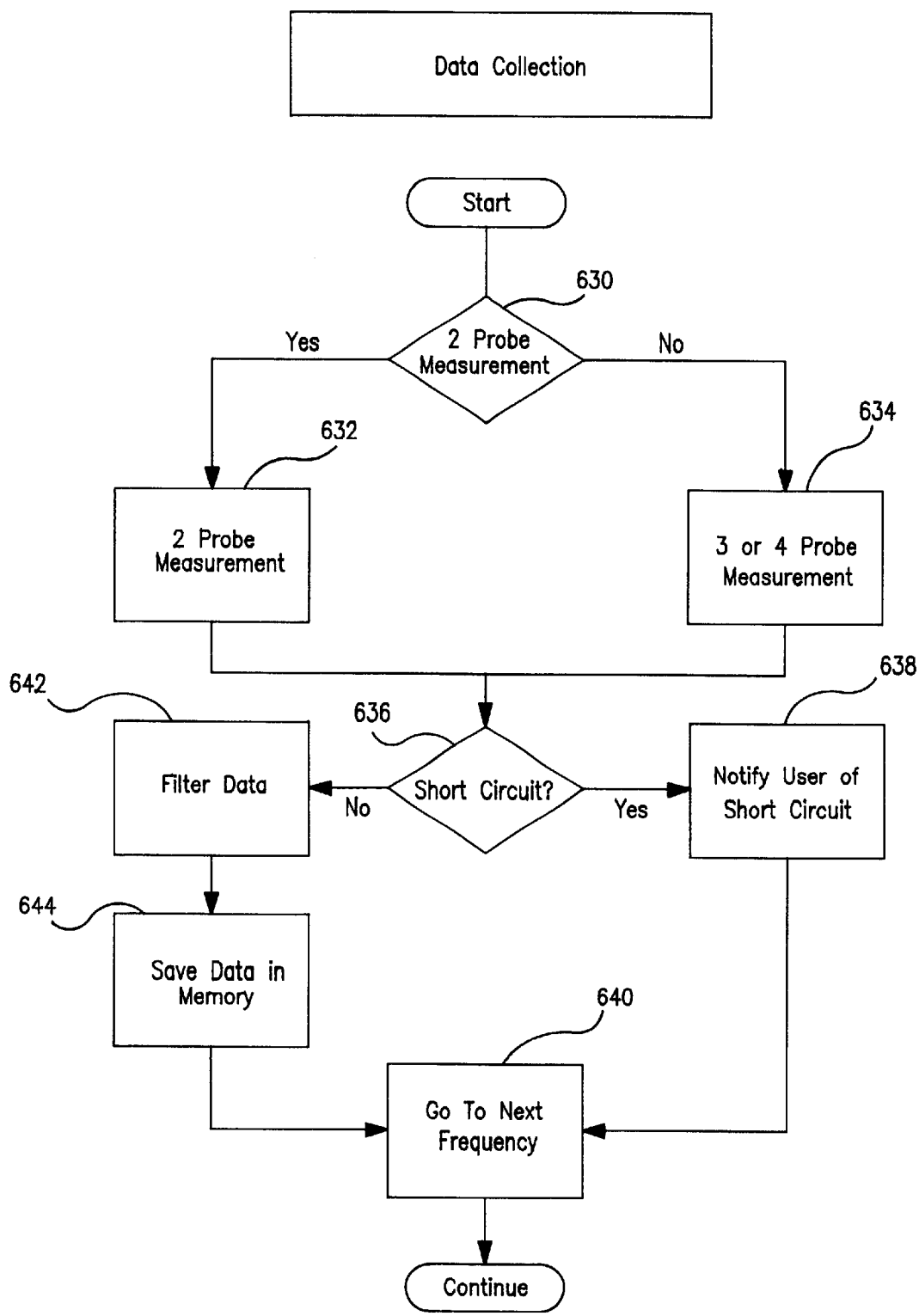
FIG. 8 is a flow diagram of the IS Data Collection process.

A flow chart of the Data Collection Process is shown if FIG. 8. The first step in the data collection process is to determine whether a 2 probe measurement is to be made 630. If a 2 probe measurement is to be made the 2 Probe Measurement Process is called 632 (see FIG. 9) otherwise the 3–4 Probe Measurement Process is called 634 (see FIG. 10). After either of these routines has been called the system checks if there is a short circuit 636. If there has been a short circuit the user is notified 638 and control is returned to the calling routine. If there has not been a short circuit the Filter Data Process is called 642 (see FIG. 13), the filtered data is saved 644, the next frequency is set 640, and control is returned to the calling routine.

Figure 9:
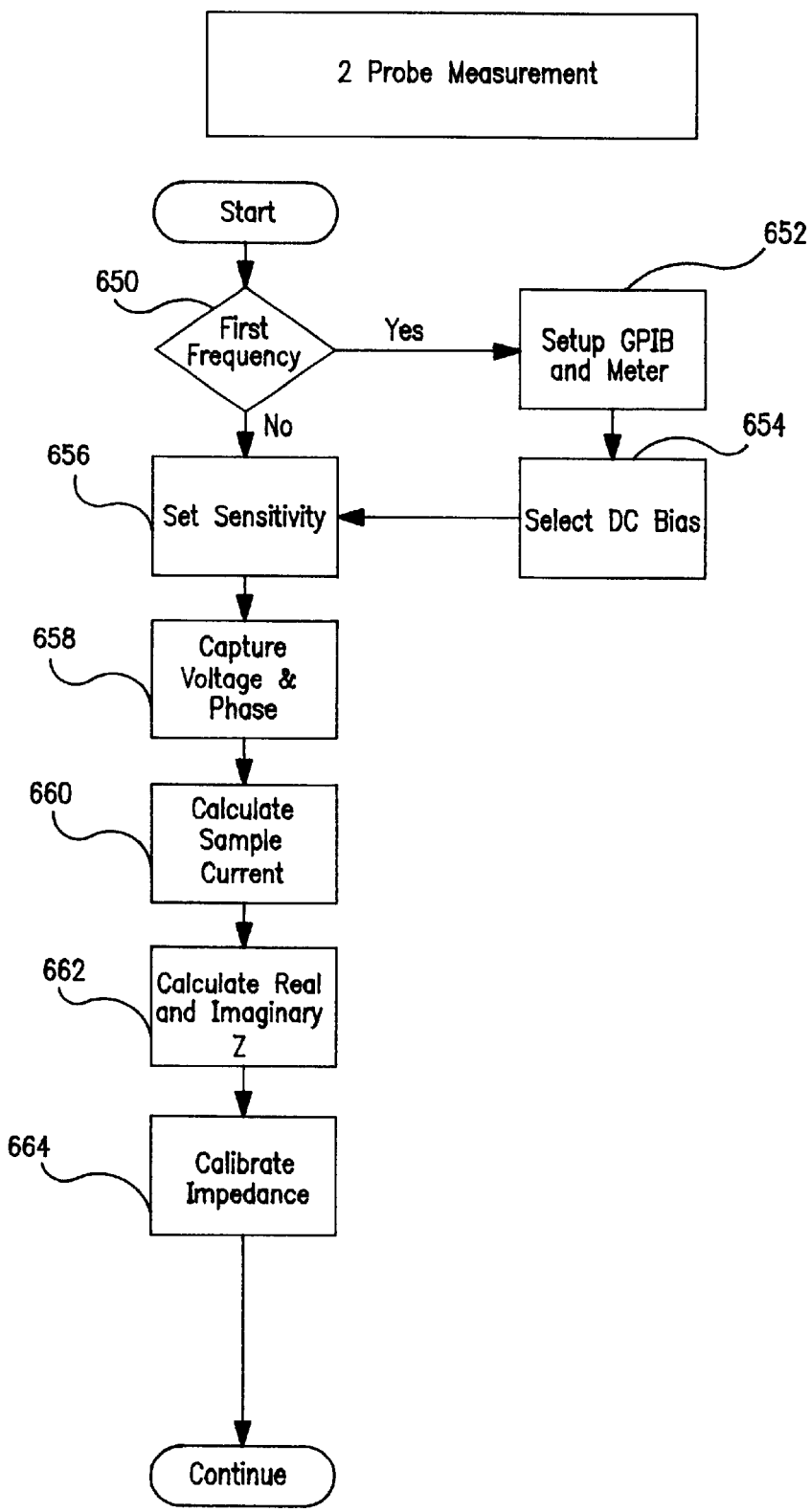
FIG. 9 is a flow diagram of the 2-Probe Measurement process.

A flow chart of the 2 Probe Measurements Process is shown in FIG. 9. The process checks if this is the first frequency to be collected for this test 650. If this is the first frequency the system performs some initialization routines which include setting up the GPIB and the Meter 652 and selecting the DC bias 654. The GPIB controller setup initiates the handshaking protocol for future controller communication. The SR-810 meter 14 setup entails sending data, such as user selected voltage levels, low-pass filter settings, front-end coupling information, and grounding configuration. The DC bias selection is for the DC bias added by the IS DC modualted signal enhancer 18.

After the initialization routines are complete, or if this was not the first frequency to be collected the process performs the steps to collect the real and imaginary impedance data for this frequency. The first step is to call the Set Sensitivity process 656 (see FIG. 11) to determine the proper meter setting. The next step is to call the Capture Voltage & Phase process 658 (see FIG. 12) to actually collect the data. After this the process calculates the sample current 660, calculates the real and imaginary impedance 662, and calibrates the impedance 664. Then control is returned to the calling routine.

Figure 10:
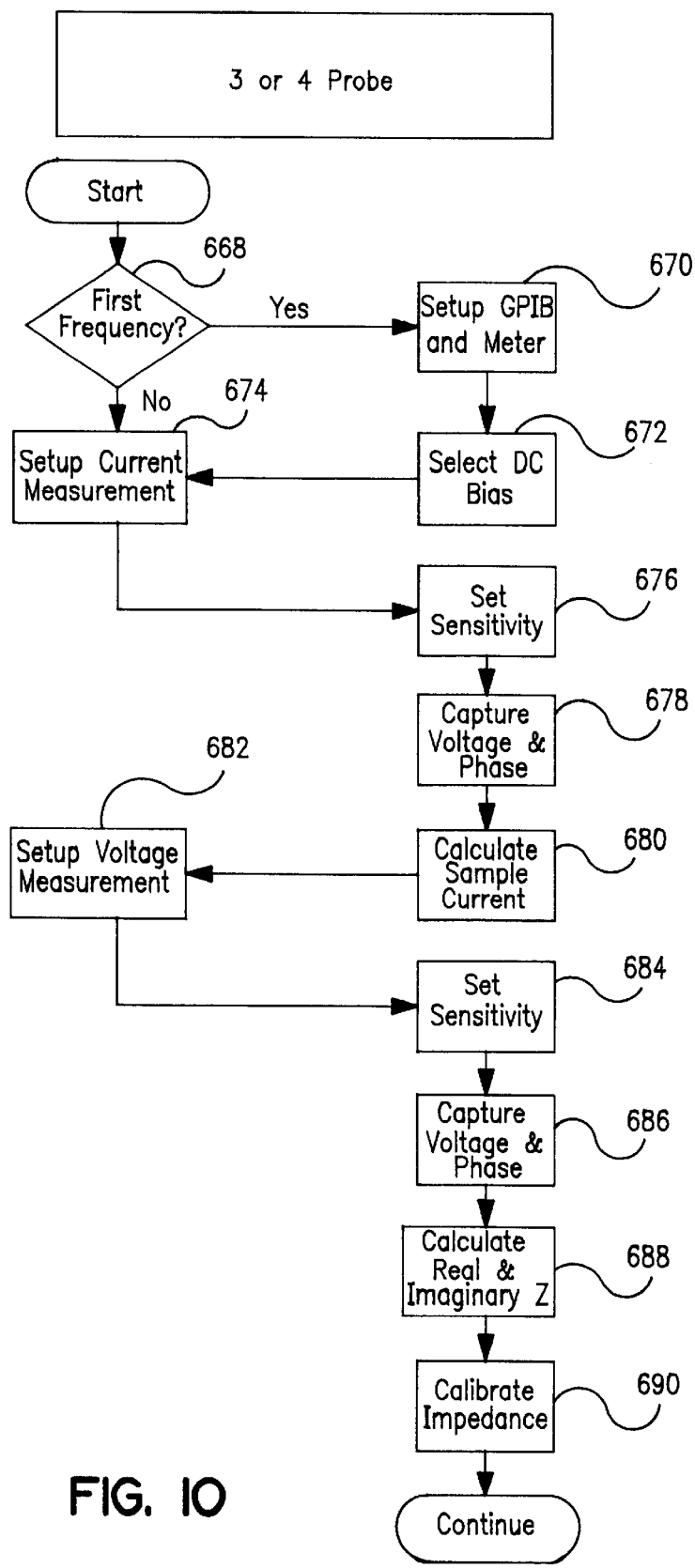
FIG. 10 is a flow diagram of the 3 or 4-Probe Measurement process.

A flow chart of the 3–4 Probe Measurements Process is shown in FIG. 10. The process checks if this is the first frequency to be collected for this test 668. If this is the first frequency the system performs some initialization routines which include setting up the GPIB and the Meter 670 and selecting the DC bias 672. After the initialization routines are complete, or if this was not the first frequency to be collected the process switches the relays to perform a current measurement 674. The Set Sensitivity process 676 (see FIG. 11) is called to determine the proper SR-810 meter 14 setting. Then the process calls the Capture Voltage & Phase process 678 (see FIG. 12) to actually collect the data at this frequency, and the sample current is calculated 680.

After the current measurements are complete, the process captures the voltage and phase for this frequency with the relays set to sample voltage. The process switches the relays to sample the voltage measurement 682. The Set Sensitivity process 684 (see FIG. 11) is called to determine the proper meter setting, then the Capture Voltage & Phase process 686 (see FIG. 12) is called to collect the data. The real and imaginary impedance is calculated 688, and the impedance is calibrated 690. Then control is returned to the calling routine.

Figure 11:
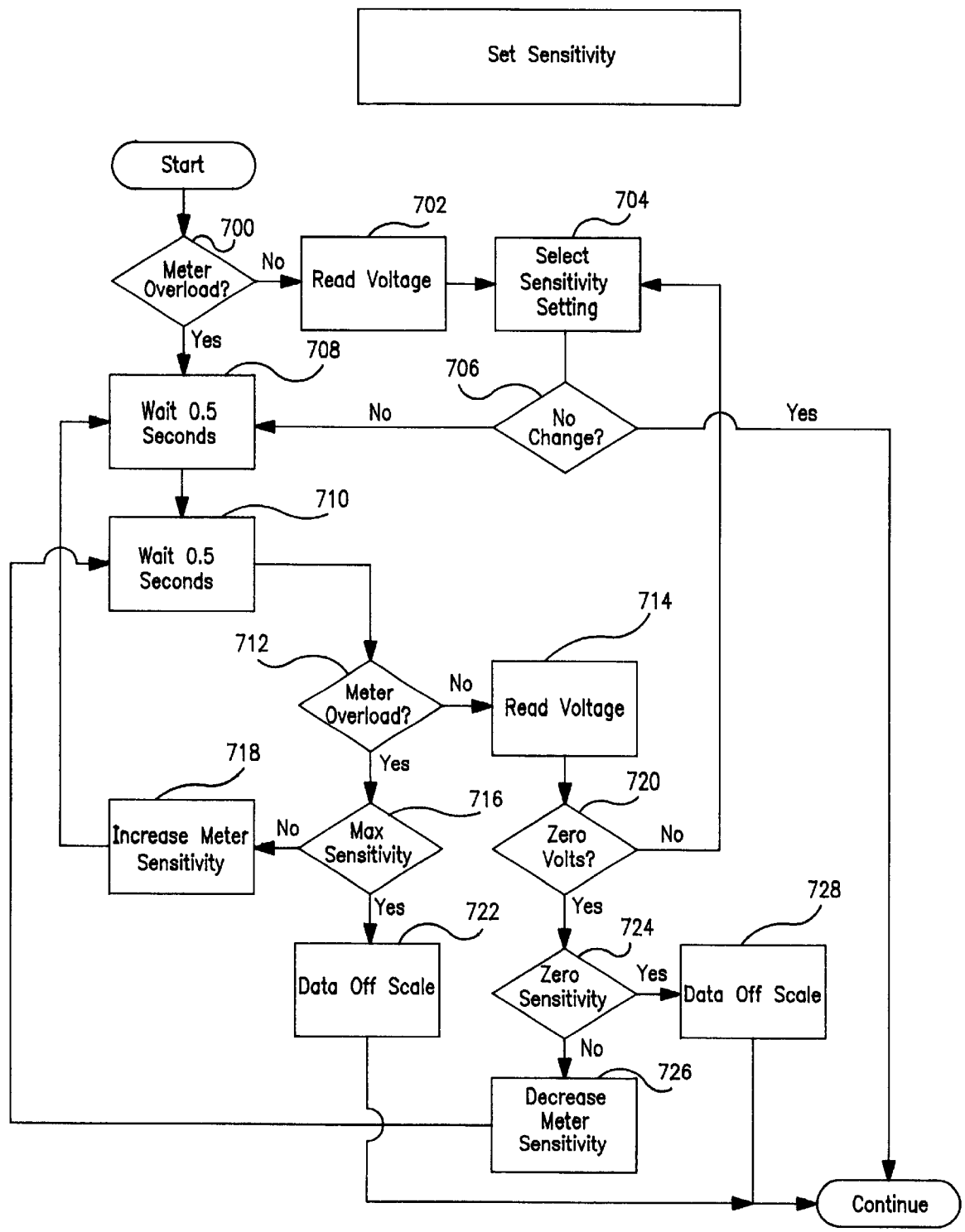
FIG. 11 is a flow diagram of the Set Sensitivity process.

The Set Sensitivity process flow chart is shown in FIG. 11. Meter sensitivity is a gain setting on the front end of the SR-810 meter 14. If the sensitivity is set too low, the front-end amplifier will saturate, if set too high, the measurement will not be made at an optimum resolution. If the meter sensitivity is too low or too high, this process will make the appropriate changes to establish an optimum sensitivity setting. The process first checks if the meter is overloaded 700, (i.e. the front end amplifiers are saturated). If the meter is not overloaded the voltage is read 702 and the sensitivity setting is selected based on the reading 704. If this setting is the same as the current selection 706 then the process is finished and control is returned to the calling routine. If the setting is not the same or the meter is overloaded then the process enters a series of two 0.5 second wait states 708, 710 to allow the meter to settle.

The process again checks if the meter is overloaded 712. If the meter is overloaded it checks if the meter sensitivity is already at its maximum setting 716. If the meter is already at the maximum setting a message indicating the data is off scale is returned 722, otherwise the sensitivity setting is increased 718 and the process returns to the series of two 0.5 second wait states 708, 710 to allow the meter to settle. If the meter is not overloaded the voltage is read 714 and the process checks whether the voltage reading is zero 720. If the voltage reading is not zero control goes back to the select sensitivity step 704. If the voltage reading is zero the process checks if the meter sensitivity is already at the minimum setting 724. If the meter is already at the minimum setting a message indicating the data is off scale is returned 728, otherwise the sensitivity setting is decreased 726 and the process returns to the second 0.5 second wait state 710 to allow the meter to settle.

Figure 12:
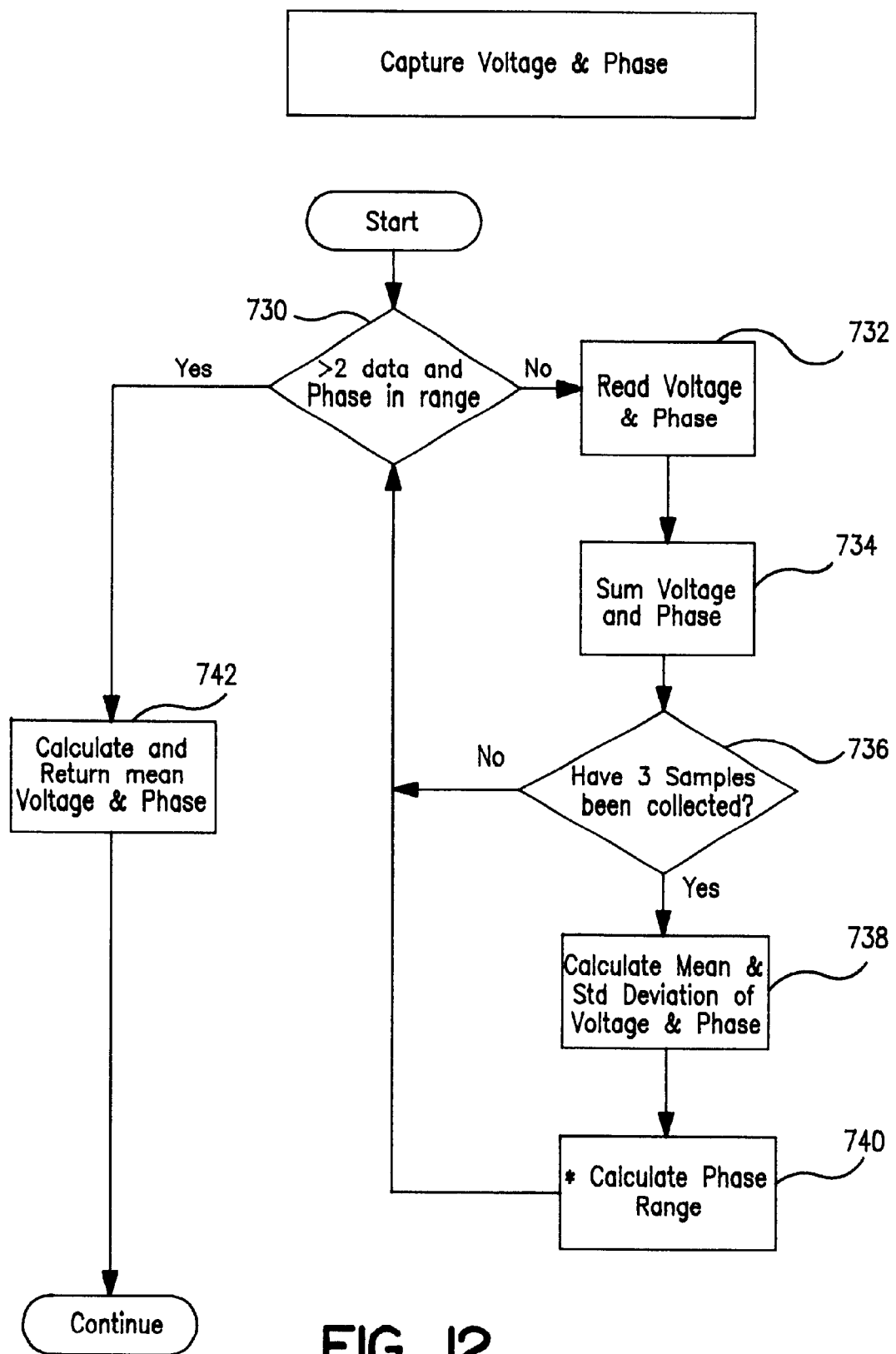
FIG. 12 is a flow diagram of the Capture Voltage & Phase process.

The Capture Voltage & Phase process is shown in FIG. 12. The process first checks if more than two data points have been collected with phase in range 730. If there are not more than two data points collected with phase in range the voltage and phase measurements are read 732 and summed 734. The process then checks if three data points have been collected 736. If three data points have been collected the mean and standard deviation of the voltage and phase are calculated 738 and the phase range is calculated 740. The maximum of the phase range is the mean of the phase plus a constant times the standard deviation of the phase and the minimum of the phase range is the mean of the phase minus a constant times the standard deviation of the phase. The process then returns to check if more than two data points have been collected with phase in range 730. After three data points have been collected in range the voltage and phase means are calculated and returned 742.

Figure 13:
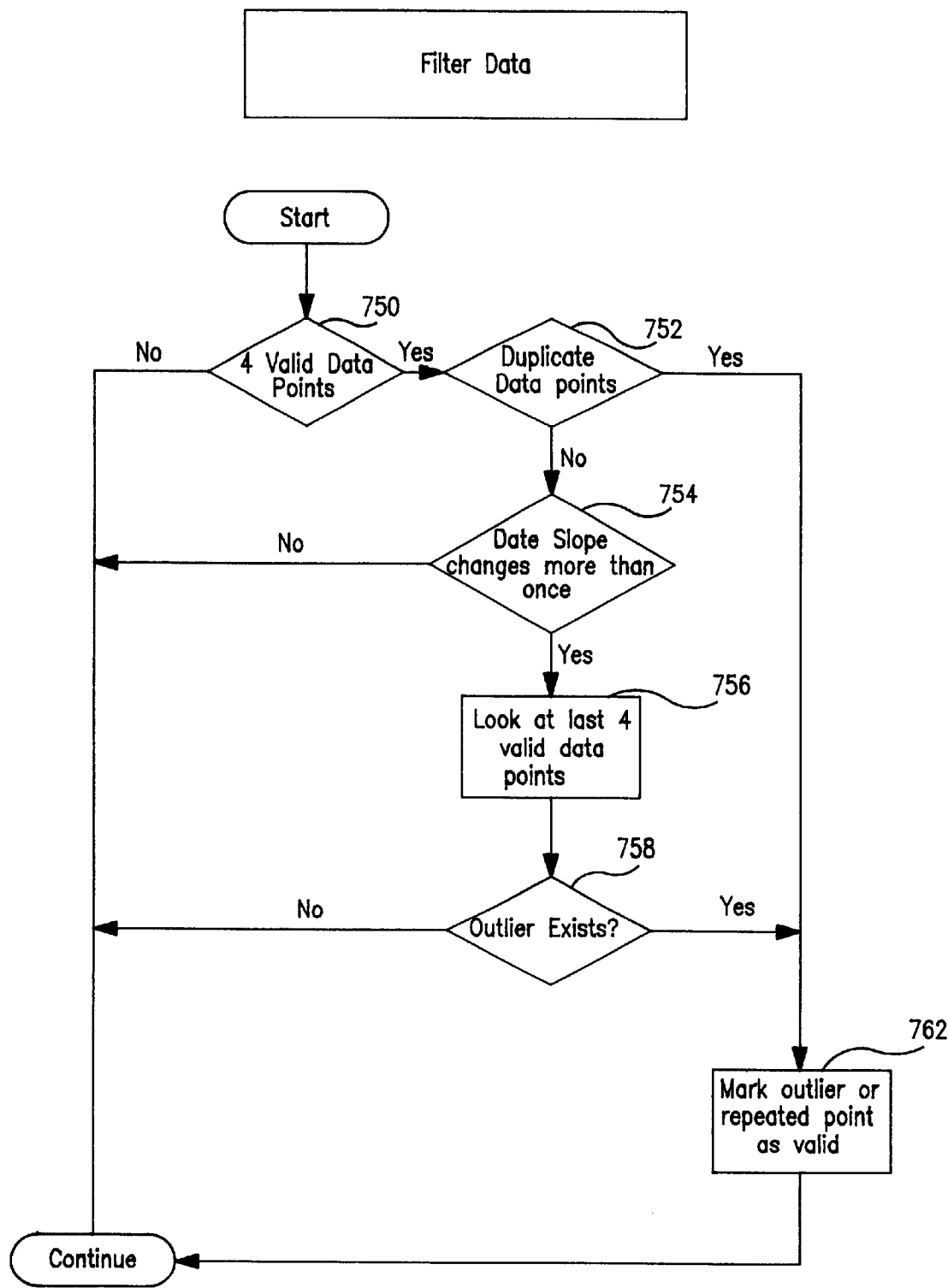
FIG. 13 is a flow diagram of the Filter Data process.

After the impedance data collection is completed at the frequencies and for the probe arrangement defined by the user, the software filters the data (see FIG. 8). The Filter Data process flow diagram is illustrated in FIG. 13. The process checks the collected data points in groups of four valid data points at a time 750 for duplicate data and for outliers. First the data points are checked to determine if there are duplicates 752. If there is a duplicate it is marked invalid 762 and control is returned to the calling routine. If there is not a duplicate the process checks if the data changes slope more than once 754. If the four data points do not change slope more than once control is returned to the calling routine. If the four data points do change slope more than once then the last four valid points are checked 756 to see if an outlier exists 758. If an outlier exists it is marked as invalid 762 and control is returned to the calling routine. If there is not an outlier control is returned to the calling routine.

Figure 14:
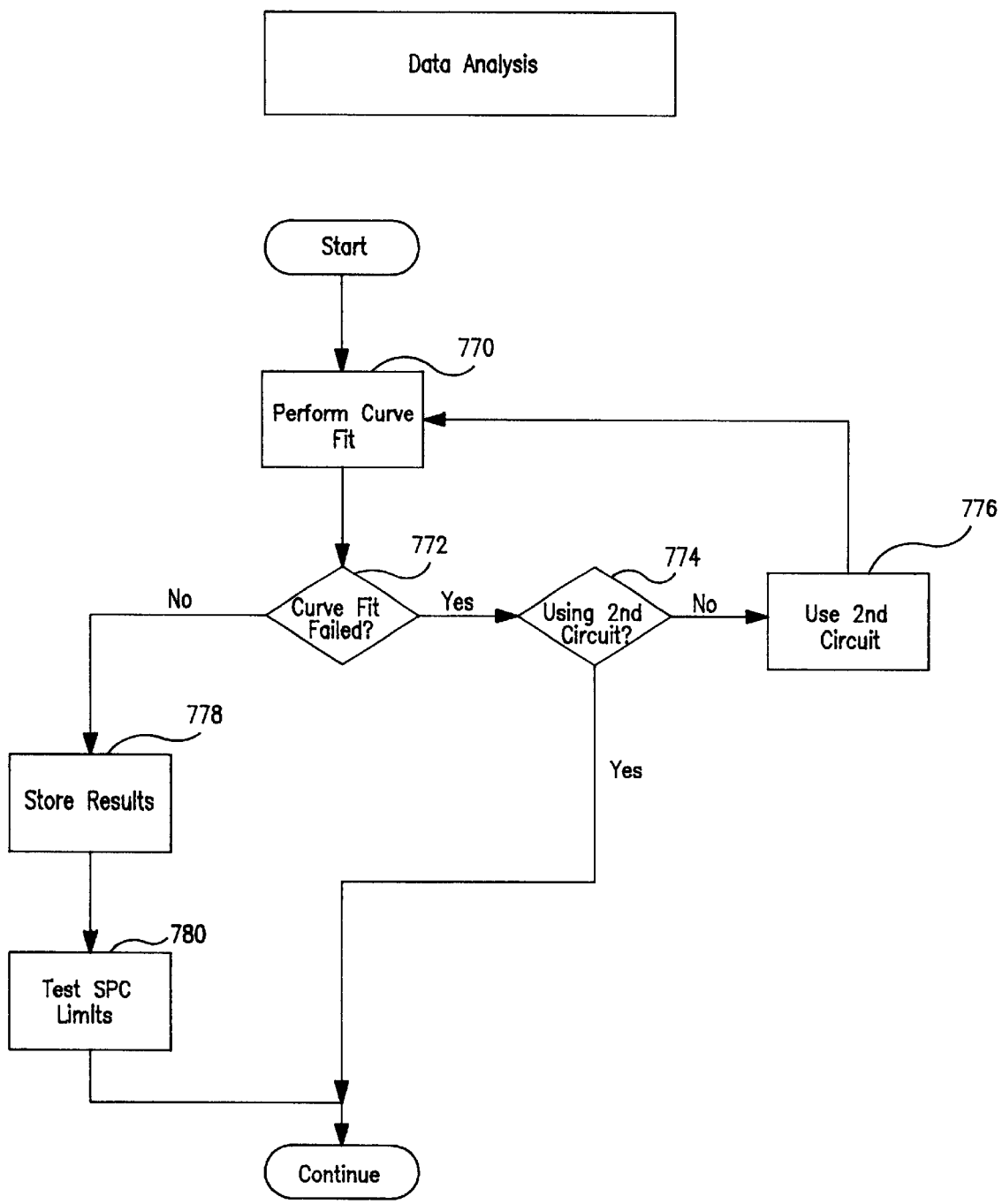
FIG. 14 is a flow diagram of the Data Analysis process.

After the data has been collected and filtered the analysis mode is entered (see FIG. 7). The Data Analysis process is shown in FIG. 14. The first step of data analysis is to call the curve fit routine 770 (see FIG. 15). When the curve fit routine finishes the process checks if the curve fit failed 772. If the curve fit did not fail, the results of the curve fit are stored 778, the Test SPC Limits process is called (see FIG. 17), and control is returned to the calling routine. If the curve fit failed the process checks if the second equivalent circuit for the solder paste has been tried 774. If it has not, the second circuit is loaded 776 and the curve fit routine is called again 770. If the second circuit has already been tried and failed control is returned to the calling routine.

Figure 15:
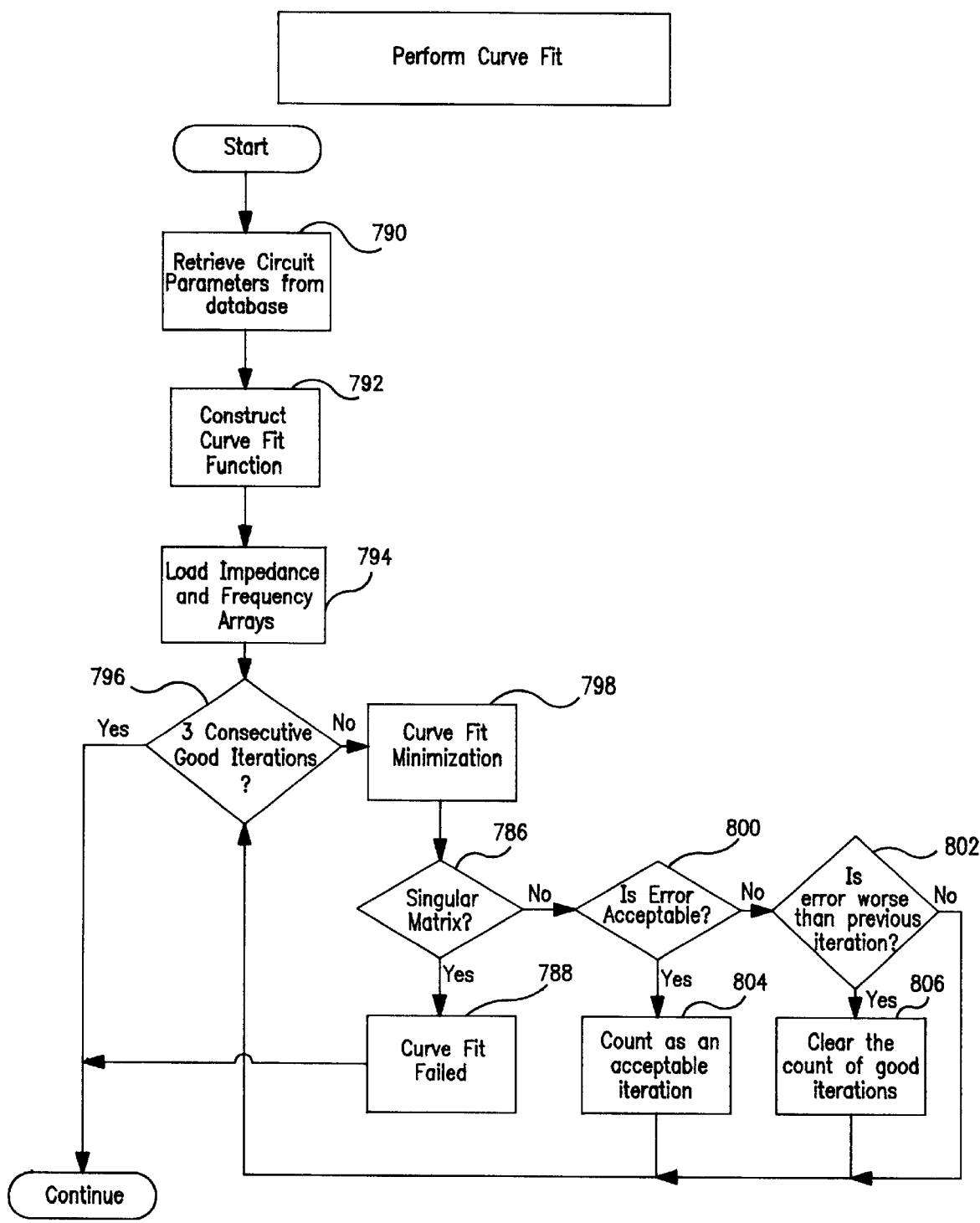
FIG. 15 is a flow diagram of the Perform Curve Fit process.

The flow chart for the Perform Curve Fit process is shown in FIG. 15. First the circuit parameters (i.e. series & parallel construction of resistors and capacitors with starting values from which the iterative curve fitting process will commence) are retrieved 790. A mathematical function is constructed 792 from the circuit structure provided that calculates the real and imaginary impedance. The impedance and frequency data collected from the solder paste test is loaded into arrays 794. The process then performs an iterative process to find a curve fit of the constructed mathematical function against the collected data with an acceptable error. The process is successful if there have been three consecutive acceptable iterations.

First, the process checks if there have been three consecutive acceptable iterations 796, and if there have been then control is returned to the calling routine. If there have not been three consecutive acceptable iterations the Curve Fit Minimization process (see FIG. 16) is called 798. The process checks if the curve fit minimization routine returns a singular matrix 786. If a singular matrix was returned, the process indicates that the curve fit failed 788 and control is returned to the calling routine, otherwise the process checks if the curve fit error is acceptable 800. If the error is acceptable then the iteration is counted as acceptable 804 and the process returns to check if the consecutive acceptable iteration count has reached three 796. If the error is not acceptable the process compares the curve fit error against the error of the previous iteration 802. If the error is not worse the process returns to check if the consecutive acceptable iteration count has reached three 796, otherwise the acceptable iteration count is cleared 806 and the process returns to check if the consecutive acceptable iteration count has reached three 796.

Figure 16:
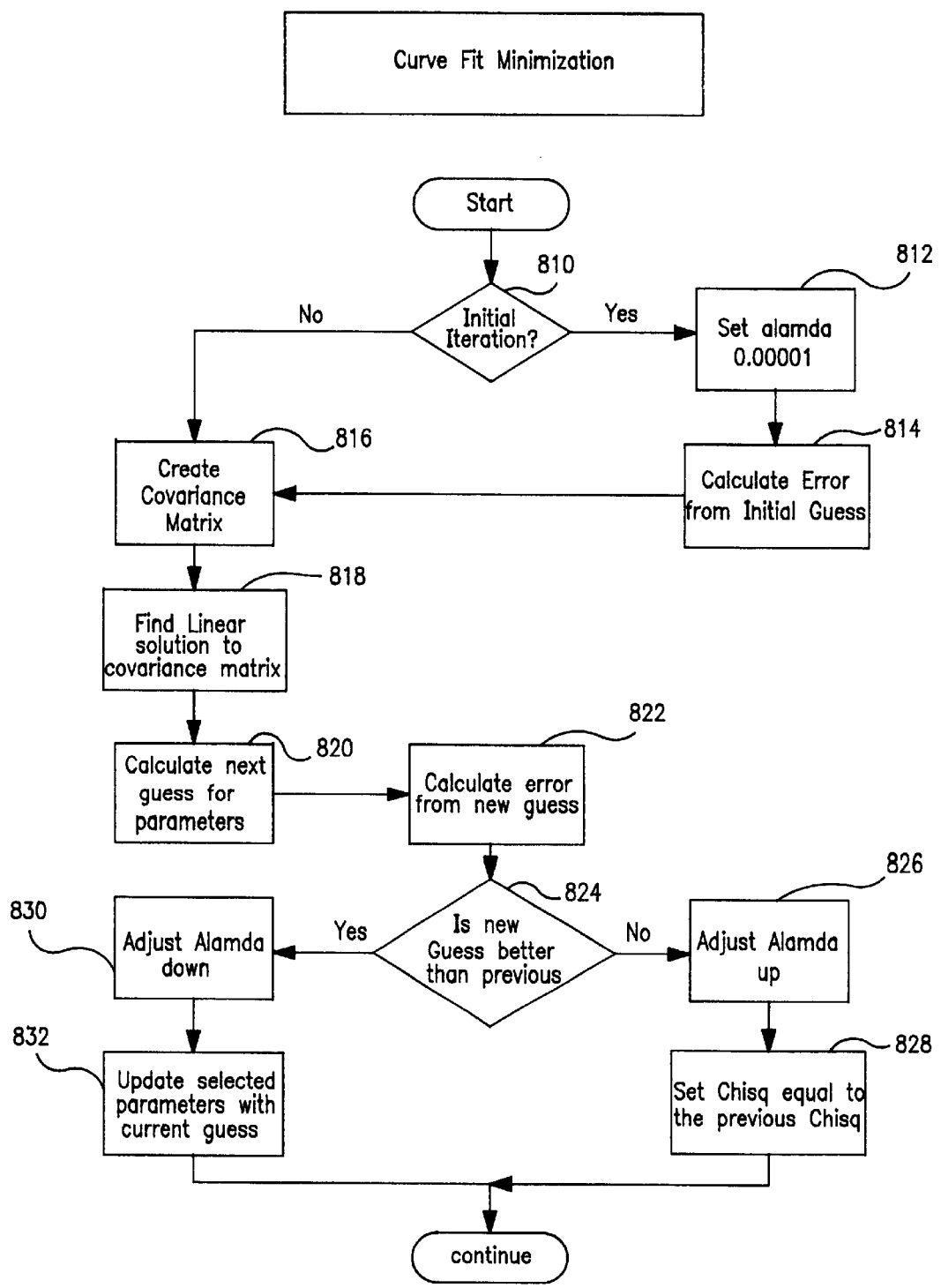
FIG. 16 is a flow diagram of the Curve Fit Minimization process.

The Curve Fit Minimization routine is shown in FIG. 16. If this is the initial iteration 810, the variable alambda is set to 0.00001 812 and the error is calculated from the initial values retrieved from the data base 814. A covariance matrix is created 816 and a linear solution to the covariance matrix is found 818. The next guess for the parameters is calculated 820 using the solution to the covariance matrix and the alambda value. The error using the new set of estimated parameters is calculated 822. The error using the new set of estimated parameters is compared against the error using the previous set 824. If the new guess is better, alambda is adjusted down 830 and the parameters are updated with the new guess 832. If the new guess is not better, alambda is adjusted up 826 and the error is reset to the error of the previous iteration 828. The curve fit minimization algorithm returns the chi-square error and the estimated circuit component parameters to the calling routine.

Figure 17:
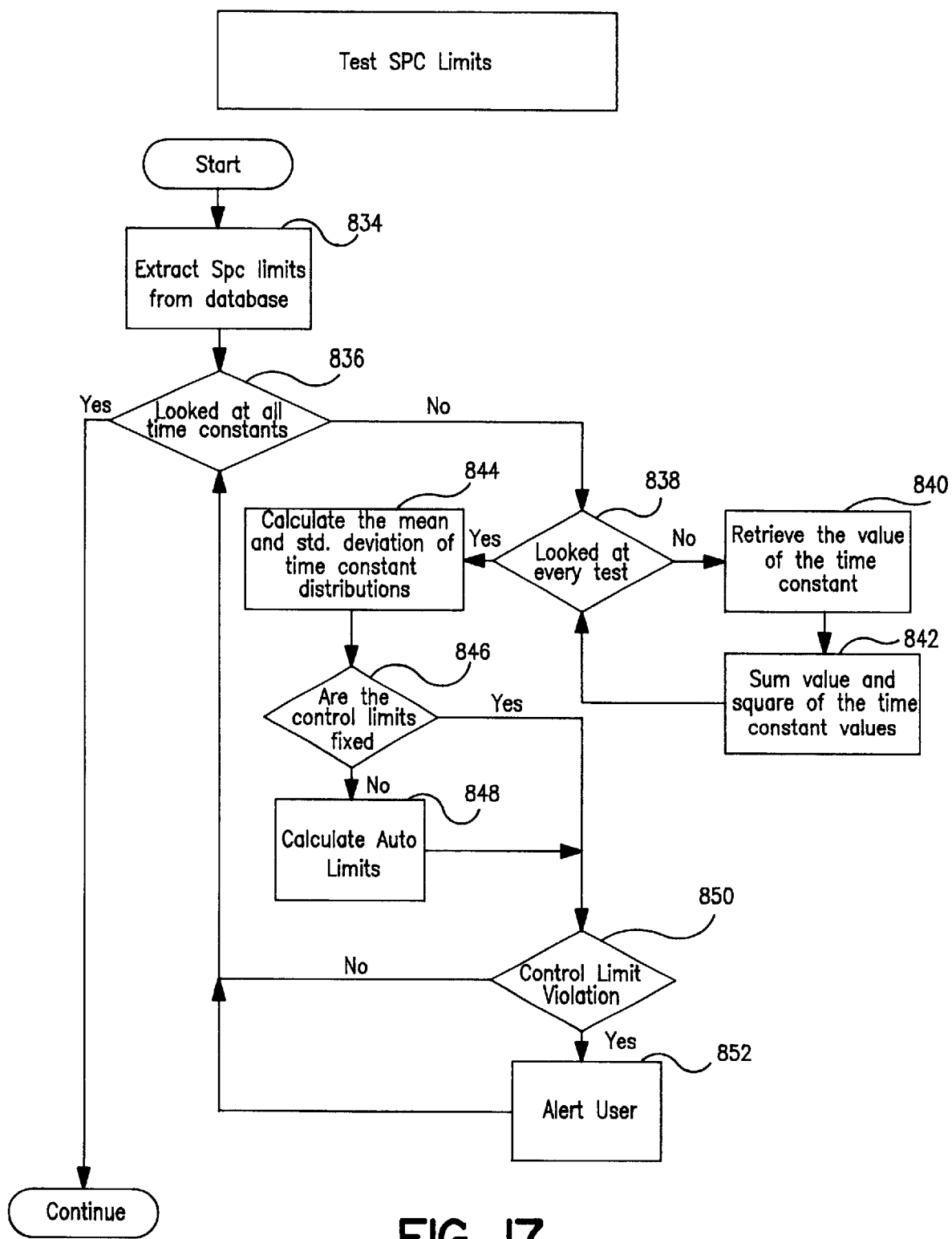
FIG. 17 is a flow diagram of the Test SPC Limits process.

After the data is analyzed, the best-fit circuit parameters are compared with the user defined Statistical Process Control (SPC) limits (see FIG. 14). The Test SPC Limits process is shown in FIG. 17. First the SPC limits are retrieved from the database 834. Once all the time constants have been checked control will return to the calling routine.

For every test 838 in the inspection set for a particular solder paste, the time constant value is retrieved from the database 840, and sums are made of the time constants and of the squares of the time constants 842. When the time constants for all the tests have been summed the mean and standard deviation of the time constant distribution are calculated 844. The process then checks if the control limits have been fixed by the user 846. If the control limits have not been fixed the process automatically calculates limits based on the sample mean, standard deviation, and the user selected K value (K values are used in SPC systems to expand and contract the control of a process) 848, otherwise the fixed control limits are used. Finally the time constant statistics are checked to determine if they violate the control limits 850, and if they do the user is alerted 852. The process then returns to check if all the time constants have been looked at 836.

Manufacturing Interface & Modeling

The utility of using impedance spectroscopy on solder paste and residue materials is to provide more control in their use in manufacturing. Solder paste specifically is a very dynamic material that can readily deteriorate within a single shift in manufacturing. A generic list of solder paste failure modes is as follows:

a) moisture absorption causing excessive powder oxidation due to the moisture acting as a catalyst for accelerated oxidation, b) moisture absorption causing solder balling due to volitilization of the water vapor during the reflow process, c) changes in the rheologic properties (viscosity and thixotropic index), c) increased powder oxidation state, or d) inactivation or immobility of the activator.

Therefore, in order for this system to function as a solder process control device for solder paste, there must be strong correlations between the data generated by this measurements system and the behavior of solder paste in manufacturing. In order to provide this level of correlation both linear regression techniques and probabilistic failure analysis techniques were employed.

Figure 18:
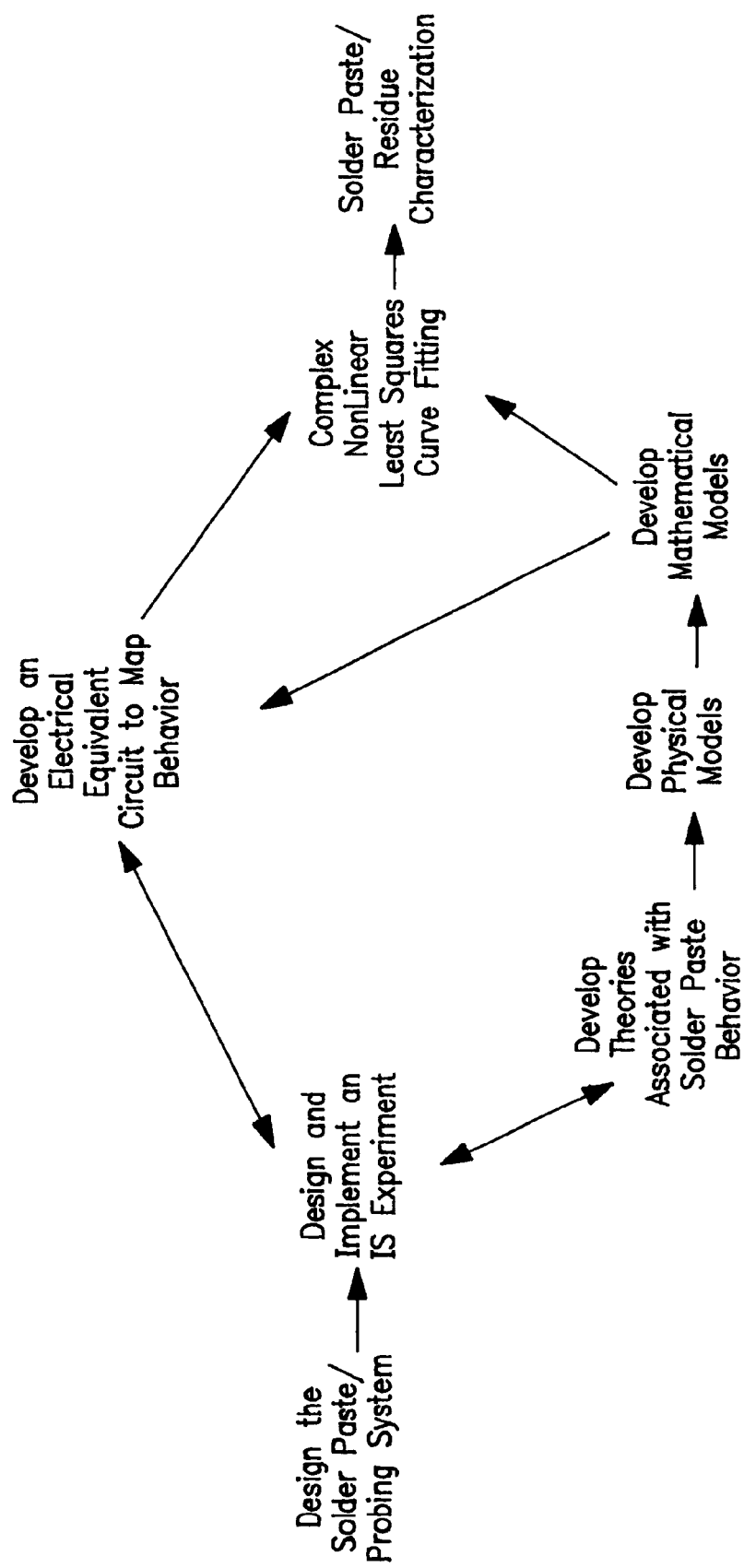
FIG. 18 illustrates the approach used to characterize solder paste using IS techniques.

The approach of Impedance Spectroscopy (IS) is to electrically map physical changes in materials using electrical equivalent components. The logic associated with implementing IS for solder paste materials is provided in FIG. 18. The first step in implementing IS techniques for controlling solder paste is to design a solder paste/residue probing system. The probing system implemented has a great effect on the physical phenomenon measured with the solder paste. As an example, a 2 probe measurement scheme concentrates on measuring the bulk behavior of the material, a 3 probe system measures interface behavior (i.e., reaction, diffusion, adsorption, etc.), and a 4 probe measurement incorporates both interface and bulk behavior. The next step is to design an experiment that will cause changes in the solder paste material that resemble the type of changes that can be seen in manufacturing. After the experiment is designed, the next step is to establish theories and models that map the behavior of the solder paste and to develop an equivalent electrical circuit that exhibits the same behavior. Once the appropriate equivalent electrical circuit is found, curve fitting routines can be employed to derive specific component values within the electrical circuit. From this point on, the characteristic changes in the solder paste can be correlated with specific components or sets of components within the equivalent circuit. Variations in the equivalent circuit component values can then be used to determine the changes occurring in the solder paste being tested.

It will be understood that various modifications can be made to the system disclosed in this application without changing the scope of the invention as set forth in the Claims attached hereto.

What is claimed is:

1. An impedance spectroscopy system comprising:

a computer, an AC signal generator that generates an AC signal having a selectable amplitude and a selectable phase, wherein the computer selects the amplitude and the phase of the AC signal, a DC signal enhancer that amplifies the AC signal by a selectable first amplification factor and generates a DC bias signal having a selectable level, the DC signal enhancer producing a resultant signal having an amplitude equal to the sum of the amplitude of the amplified AC signal and the level of the generated DC bias signal and having a known phase characteristic, the resultant signal being amplified by a selectable second amplification factor, wherein the computer selects the first amplification factor, the level of the DC bias signal, and the second amplification factor, an interface board having a probe interface to which a probe is connected that transmits the amplified resultant signal to a sample under test, and receives at least one response signal from the probe, wherein the interface board selectably performs at least one of a 2-probe, 3-probe and 4-probe type impedance measurement, the interface board having selectable load resistances for an impedance measurement, wherein the computer selects the type of impedance measurement and the load resistance, a high-impedance preamp that isolates each of the at least one response signal and independently amplifies each of the at least one response signal by a selectable amplification factor, wherein the computer selects the amplification factor, and a response signal measurement system that detects the amplified isolated response signal and measures the magnitude of the response signal and the change in phase from the amplified resultant signal to the response signal, the response signal measurements being communicated to the computer for storage, display and analysis.

2. The impedance spectroscopy system of claim 1 wherein the computer can be preset to automatically generate a series of resultant signals at a specified time, measure a characterization of a response signal for each resultant signal of the series of resultant signals, store and analyze the characterizations of the response signals.

3. The impedance spectroscopy system of claim 2 wherein the computer can be preset to automatically generate more than one series of resultant signals, separately measure a characterization of a response signal for each resultant signal of each series of resultant signals, and separately store and analyze the characterizations of the response signals.

4. The impedance spectroscopy system of claim 1 including a switch matrix having an input probe interface and multiple output probe interfaces, the input probe interface of the switch matrix being connected to the probe interface of the interface board, each of the multiple output probe interfaces being connected to a probe which is in contact with one of at least one samples under test; such that the switch matrix channels the amplified resultant signal from the input probe interface to a selected output probe interface of the switch matrix and channels at least one response signal from the selected output probe interface to the input probe interface for transmission to the interface board.

5. The impedance spectroscopy system of claim 4 wherein the computer can be preset to automatically generate a series of resultant signals at a specified time, measure a characterization of a response signal for each resultant signal of the series of resultant signals, store and analyze the characterizations of the response signals.

6. The impedance spectroscopy system of claim 5 wherein the computer can be preset to automatically generate more than one series of resultant signals and wherein each response signal can be from at least one of the same switch matrix output probe interface and different switch matrix output probe interfaces.

7. The impedance spectroscopy system of claim 1 wherein the system displays a notification when there is a short circuit in the system.

8. The impedance spectroscopy system of claim 1 wherein the response signal measurements are analyzed by the computer to produce several characterizations of the response signal and of the sample under test, multiple characterizations being selectively displayable.

9. The impedance spectroscopy system of claim 1 wherein the computer has both an engineering mode and an operator mode, the operator mode providing limited access to controls available in the engineer mode.

10. The impedance spectroscopy system of claim 9 wherein a user in the engineer mode can determine the controls accessible in the operator mode.

* * * * *